US007456669B2

(12) United States Patent
Teh et al.

(10) Patent No.: US 7,456,669 B2
(45) Date of Patent: Nov. 25, 2008

(54) SEMICONDUCTOR INTEGRATED CIRCUIT DEVICE

(75) Inventors: Chen Kong Teh, Tokyo (JP); Mototsugu Hamada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 11/439,271

(22) Filed: May 24, 2006

(65) Prior Publication Data
US 2006/0267627 A1  Nov. 30, 2006

(30) Foreign Application Priority Data
May 25, 2005  (JP) ............................ 2005-152901
May 22, 2006  (JP) ............................ 2006-142134

(51) Int. Cl.
*H03K 3/00* (2006.01)
(52) U.S. Cl. ..................................... 327/218; 327/199
(58) Field of Classification Search ................ 327/199, 327/200, 201, 218
See application file for complete search history.

(56) References Cited

U.S. PATENT DOCUMENTS

| 5,825,224 | A  | * | 10/1998 | Klass et al. | ................ 327/200 |
| 6,265,923 | B1 | * | 7/2001  | Amir et al.  | ................ 327/218 |
| 6,853,228 | B2 | * | 2/2005  | Hirata et al.| ................ 327/199 |
| 2004/0130370 | A1 | * | 7/2004 | Tohsche | ..................... 327/215 |
| 2005/0040873 | A1 | * | 2/2005 | Wada et al. | ................. 327/215 |

FOREIGN PATENT DOCUMENTS

JP  2004-56667  2/2004

OTHER PUBLICATIONS

Zhao et al., HighPerformance and Low-Power Conditional Discharge Flip-Flop, IEEE, vol. 12, No. 5, May 2004.*
Nikola Nedovic, et al., "Hybrid Latch Flip-Flop with Improved Power Efficiency", Proceedings of the Symposium on Integrated Circuits and Systems Designs, IEEE, Sep. 18-22, 2000, pp. 211-215.
Bai-Sun Kong, et al., "Conditional-Capture Flip-Flop for Statistical Power Reduction", IEEE Journal of Solid-State Circuits, vol. 36, No. 8, Aug. 2001, pp. 1263-1271.
Peiyi Zhao, et al., "High-Performance and Low-Power Conditional Discharge Flip-Flop", IEEE Transactions on Very Large Scale Integration (VLSI) Systems, vol. 12, No. 5, May 2004, pp. 477-484.

* cited by examiner

*Primary Examiner*—Kenneth B. Wells
*Assistant Examiner*—Ryan C Jager
(74) *Attorney, Agent, or Firm*—Oblon, Spivak, McClelland, Maier & Neustadt, P.C.

(57) ABSTRACT

A semiconductor integrated circuit device includes a comparator for making a comparison between a logical value of an input signal and a logical value of an output signal and outputting a combination signal having a combination of the logical values; and a flip-flop circuit configured to maintain a state of the output signal with electric power for maintaining the state less than electric power for state transition of the output signal in the case where the combination of the logical values of the combination signal is a predetermined combination, and wherein the comparator outputs the combination signal having the predetermined combination to an input terminal portion in the case of determining that the input signal does not vary the state of the output signal based on a result of the comparison between the logical value of the input signal and the logical value of the output signal.

20 Claims, 18 Drawing Sheets

| input | | | | output | |
|---|---|---|---|---|---|
| D | DB | Q | QB | X | Y |
| H | L | H | L | L | L |
| H | L | L | H | H | L |
| L | H | H | L | L | H |
| L | H | L | H | L | L |

| input | | output | |
|---|---|---|---|
| X | Y | Q | QB |
| L | L | Q | QB |
| H | L | H | L |
| L | H | L | H |
| H | H | | | ized # SEMICONDUCTOR INTEGRATED CIRCUIT DEVICE

This application is based upon and claims the benefit of priority from the prior Japanese Patent Applications Nos. 2005-152901, filed in Japan on May 25, 2005 and 2006-142134, filed on May 22, 2006: the entire contents of which are incorporated herein by reference.

BACKGROUND OF THE INVENTION

1. Field of the Invention

The present invention relates to a semiconductor integrated circuit device, and in particular, to the semiconductor integrated circuit device including a flip-flop circuit.

2. Description of the Related Art

Conventionally, a flip-flop circuit is widely used in an integrated circuit such as LSI. And in general, power consumption of the flip-flop circuit in the integrated circuit occupies a large part of the power consumption of the entire integrated circuit. For that reason, reduction in the power consumption of the flip-flop circuit leads to reduction in the power consumption of the entire integrated circuit so as to consequently reduce heat generation of the integrated circuit. Examples of such a semiconductor integrated circuit device including the flip-flop circuit include those proposed in Document 1 (Japanese Patent Laid-Open No. 2004-056667) and Document 2 (Peiyi Zhao, Tarek K. Darwish, and Magdy A. Bayoumi, "High-Performance and Low-Power Conditional Discharge Flip-Flop." IEEE TRANCEACTIONS ON VERY LARGE SCALE INTEGRATION (VLSI) SYSTEMS, Vol. 12, NO. 5, MAY 2004 p 477 to p 484).

The semiconductor integrated circuit device proposed in Document 1 uses a clock control circuit. In the case where an input signal and an output signal of the flip-flop circuit are the same logical value, it suppresses operation of the flip-flop circuit by keeping an internal clock signal at a fixed value so as to realize the reduction in power consumption.

The semiconductor integrated circuit device proposed in Document 2 has a discharge control circuit inserted on a discharge path significantly consuming electric power. In the case where an input signal and an output signal of the flip-flop circuit are the same logical value, it puts the discharge control circuit in an open state and maintains electric charge accumulated in parasitic capacitance so as to realize the reduction in power consumption.

In the case of the semiconductor integrated circuit device proposed in Document 1, however, the clock control circuit exerts the aforementioned operational control to the flip-flop circuit. Therefore, it has a problem that the clock-output delay and setup time becomes larger so that operation speed of the entire semiconductor integrated circuit device consequently decreases.

In the case of the semiconductor integrated circuit device proposed in Document 2, the discharge control circuit is inserted on the discharge path. Therefore, it has a problem that an amount of currents on the discharge path in state transition is reduced and operation speed of the entire circuit is thereby decreased so that the circuit size (transistor size) must be enlarged to maintain the operation speed of the entire circuit.

SUMMARY OF THE INVENTION

A semiconductor integrated circuit device according to one aspect of the present invention is the one for inputting an input signal and outputting an output signal based on the input signal, including: a comparator configured to make a comparison between a logical value of the input signal and a logical value of the output signal and output a combination signal having a combination of the logical values based on a result of the comparison; and a flip-flop circuit having an input terminal portion including multiple terminals for inputting the combination signal and an output terminal portion including a terminal for outputting the output signal outputted based on the combination signal and configured to maintain a state of the output signal with electric power for maintaining the state less than electric power for state transition of the output signal in the case where the combination of the logical values of the combination signal is a predetermined combination, and wherein: the comparator outputs the combination signal having the predetermined combination of the logical values to the input terminal portion in the case of determining that the input signal does not vary the state of the output signal based on the result of the comparison between the logical value of the input signal and the logical value of the output signal.

DETAILED DESCRIPTION OF THE INVENTION

Figure 1:
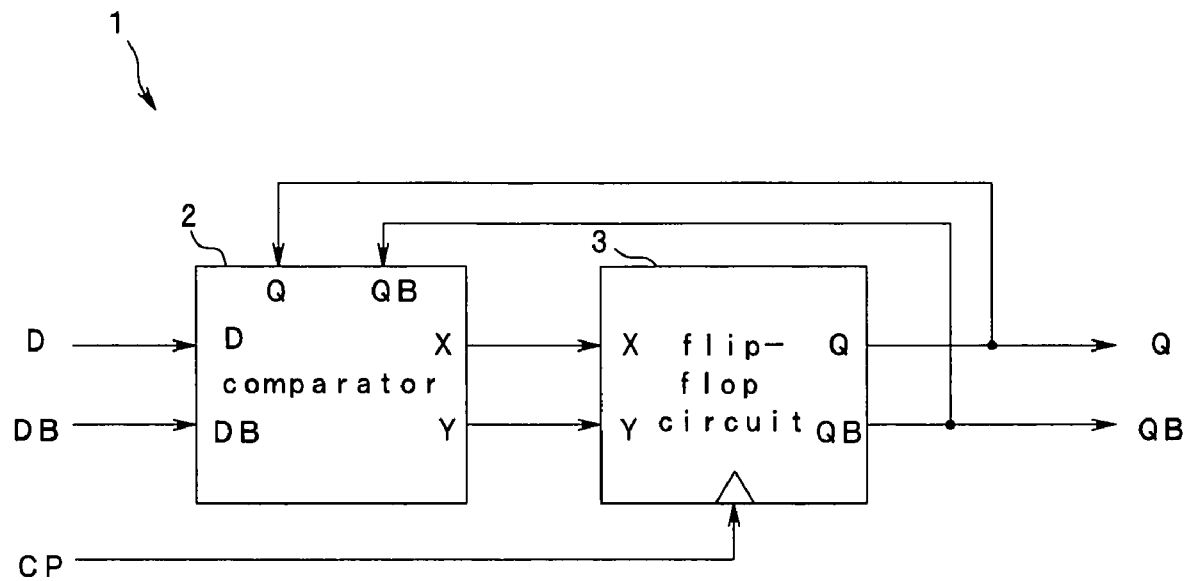
FIG. 1 is a diagram showing an example of a block diagram of a semiconductor integrated circuit device according to an embodiment of the present invention.

Hereunder, an embodiment of the present invention will be described by referring to the drawings. FIG. 1 is a diagram showing an example of a block diagram of a semiconductor integrated circuit device according to an embodiment of the present invention.

As shown in FIG. 1, a semiconductor integrated circuit device 1 includes a comparator 2 and a flip-flop circuit 3.

The comparator 2 includes a node (described as a D input terminal hereafter) for inputting a signal D as a data signal from a data input side of the semiconductor integrated circuit device 1, a node (described as a DB input terminal hereafter) for inputting a signal DB as an inversion signal of the signal D, a node (described as a Q input terminal hereafter) for inputting a signal Q as an output signal (positive phase output) from the flip-flop circuit 3, and a node (described as a QB input terminal hereafter) for inputting a signal QB as an inversion signal (inversion output) of the signal Q. Furthermore, as output terminals, it includes a node (described as an X output terminal hereafter) for outputting a signal X configuring a combination signal generated based on the signals D and QB or based on the signals DB and Q and a node (described as a Y output terminal hereafter) for outputting a signal Y configuring a combination signal generated based on the signals DB and Q or based on the signals D and QB. The nodes of the output terminals of the comparator 2 are connected to the input terminals of the flip-flop circuit 3 respectively.

Figures 3, 4, 5:
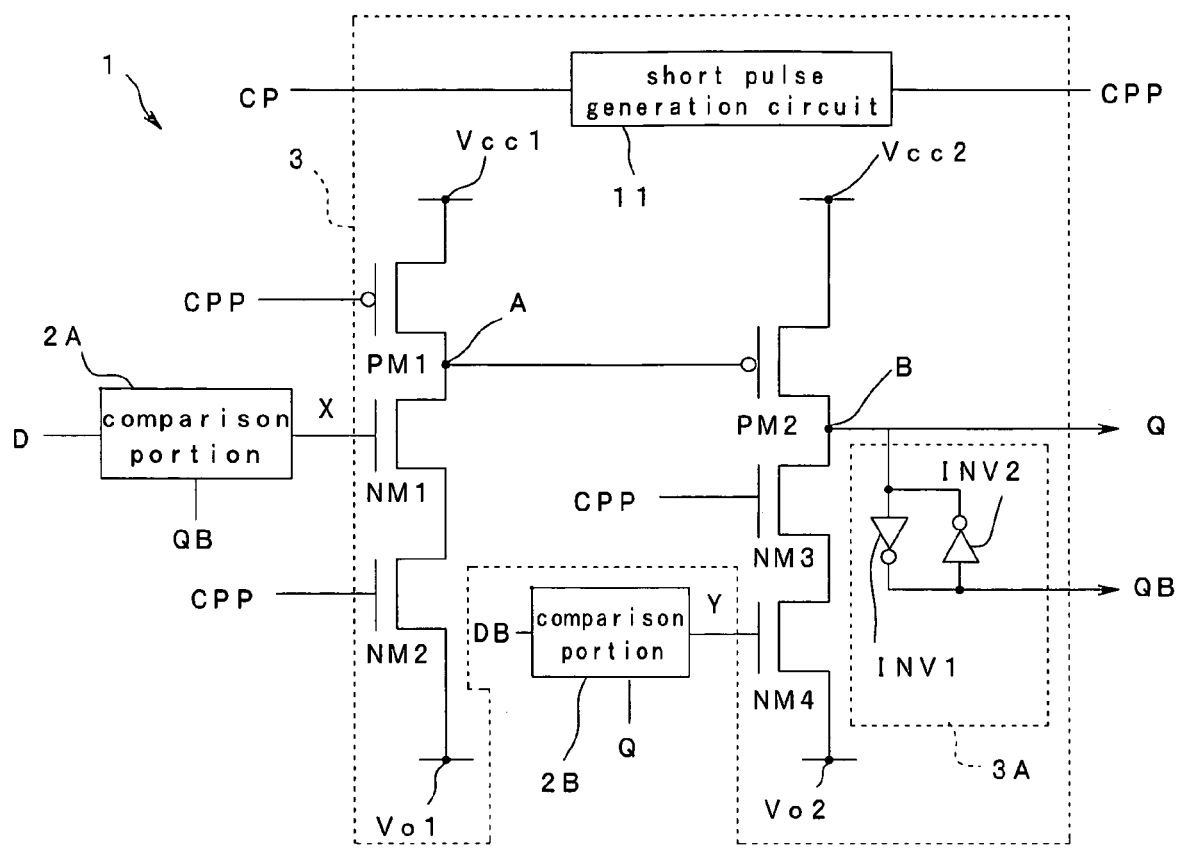
FIG. 3 is a diagram showing an example of a concrete circuit configuration of a flip-flop circuit of the semiconductor integrated circuit device according to the embodiment of the present invention.
FIG. 4 is a diagram showing an example of a truth table on operation of a comparator of the semiconductor integrated circuit device according to the embodiment of the present invention.
FIG. 5 is a diagram showing an example of a truth table on operation of the flip-flop circuit of the semiconductor integrated circuit device according to the embodiment of the present invention.

The comparator 2 shown in FIG. 1 is configured to operate based on truth values shown in FIG. 4. FIG. 4 is a diagram showing an example of a truth table on operation of the comparator of the semiconductor integrated circuit device according to the embodiment of the present invention.

The flip-flop circuit 3 includes as input terminals a node (described as a CP input terminal hereafter) for inputting a signal CP as a trigger signal, a node (described as an X input terminal hereafter) for inputting a signal X outputted from the comparator 2, and a node (described as a Y input terminal hereafter) for inputting a signal Y outputted from the comparator 2.

As for the output terminals, the flip-flop circuit 3 includes output nodes (described as a Q output terminal and a QB output terminal hereafter respectively) for outputting signals Q and QB synchronized with the signal CP and generated based on the signals X and Y. The Q output terminal and QB output terminal are the nodes for outputting the signals Q and QB to a data output side of the semiconductor integrated circuit device 1, and are connected to the Q input terminal and QB input terminal of the comparator 2 respectively.

The flip-flop circuit 3 shown in FIG. 1 is configured to operate based on the truth values shown in FIG. 5. FIG. 5 is a diagram showing an example of the truth table on operation of the flip-flop circuit of the semiconductor integrated circuit device according to the embodiment of the present invention.

The flip-flop circuit 3 discharges electric charge precharged on a predetermined node (precharge node) inside the circuit according to the signals X and Y based on the truth values shown in FIG. 5 so as to pass a state transition current. In the case where the logical values based on a signal level of the inputted signals X and Y are a predetermined combination in particular, the flip-flop circuit 3 maintains an output state of the signals Q and QB without discharging the electric charge precharged on the predetermined node, that is, without passing the state transition current. For instance, a transistor connected to the X input terminal and Y input terminal maintains the output state of the signals Q and QB without passing the state transition current if the signals X and Y both having an L signal level are inputted to the X input terminal and Y input terminal respectively. The truth tables shown in FIGS. 4 and 5 are examples of those prescribed assuming such a case.

Next, a description will be given as to action of the semiconductor integrated circuit device 1 according to this embodiment. The comparator 2 of the semiconductor integrated circuit device 1 shown in FIG. 1 compares the logical values of the signals D and Q based on the signal levels thereof for instance. In the case where the logical values of the signals D and Q are different, it generates and outputs the signals X and Y having a combination of the logical values according to the signals D and DB. And the flip-flop circuit 3 passes the state transition current through a predetermined path based on the signals X and Y so as to change the state of the signal Q (to invert the logic).

Meanwhile, in the case where the logical values of the signals D and Q are the same, it generates and outputs the signals X and Y having a combination of the logical values according to a comparison result, that is, the signal X of the L level and the signal Y of the L level. And the flip-flop circuit 3 does not pass the state transition current through the predetermined path based on the signals X and Y so as to maintain the output state of the signals Q and QB (not to invert the logic).

Therefore, in the case where the output state of the signal Q is not changed by the signal D, that is, in the case where the signal D of the same logical value as that of the signal Q is inputted, consumption of electric power on the flip-flop circuit 3 is suppressed. Consequently, the semiconductor integrated circuit device 1 can eliminate redundant internal transition and thereby operate while reducing power consumption.

Figure 2:
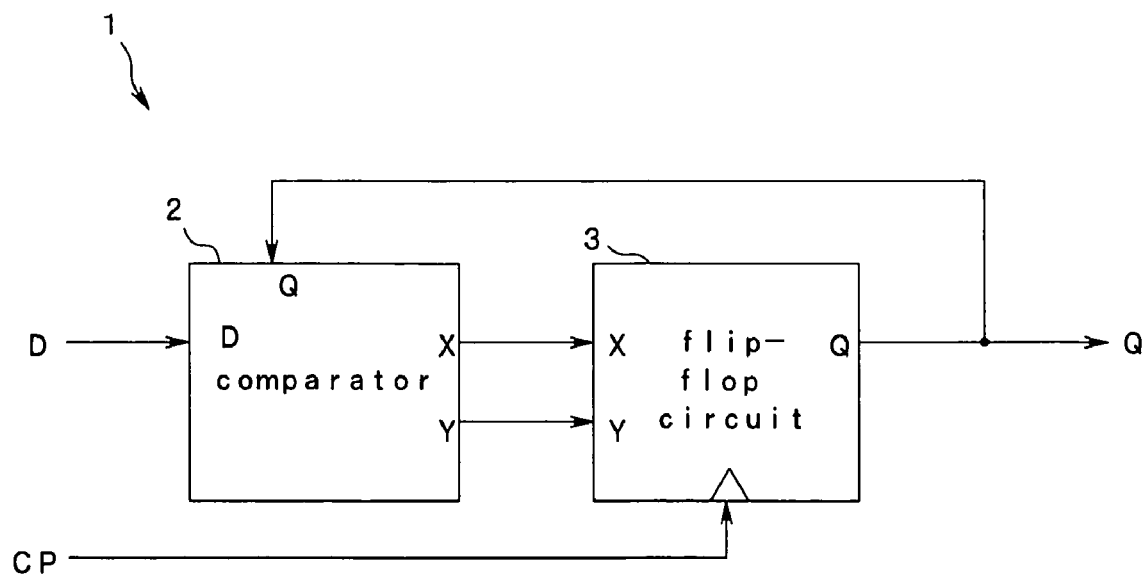
FIG. 2 is a diagram showing an example of a block diagram different from FIG. 1 of the semiconductor integrated circuit device according to the embodiment of the present invention.

The semiconductor integrated circuit device 1 shown in FIG. 1 can also operate without using the signals DB and QB. FIG. 2 is a diagram showing an example of a block diagram different from FIG. 1 of the semiconductor integrated circuit device according to the embodiment of the present invention. In that case, the semiconductor integrated circuit device 1 has a configuration shown in FIG. 2 for instance. The action and detailed operation of the semiconductor integrated circuit device 1 shown in FIG. 2 are included in the portion relating to the signals D and Q of the action and operation of the semiconductor integrated circuit device 1 shown in FIG. 1, and so a detailed description thereof will be omitted. For that reason, the semiconductor integrated circuit device 1 shown in FIG. 2 can eliminate redundant internal transition and thereby operate while reducing the power consumption as with the semiconductor integrated circuit device 1 shown in FIG. 1.

To be more precise, the semiconductor integrated circuit device 1 according to the embodiment shown in FIG. 1 is configured as a circuit shown in FIG. 3 for instance. FIG. 3 is a diagram showing an example of a concrete circuit configuration of the flip-flop circuit of the semiconductor integrated circuit device according to the embodiment of the present invention.

As shown in FIG. 3, the flip-flop circuit 3 includes a short pulse generation circuit 11. The short pulse generation circuit 11 is a circuit for outputting a pulse signal CPP having a narrower pulse width than the signal CP based on the inputted signal CP.

The comparator 2 is configured by comparison portions 2A and 2B. The comparison portion 2A has the D input terminal and QB input terminal as the input terminal portions and the X output terminal as the output terminal portion. The comparison portion 2B has the DB input terminal and Q input terminal as the input terminal portions and the Y output terminal as the output terminal portion.

P-channel MOS transistor (described as a PMOS transistor hereafter) PM 1 of the flip-flop circuit 3 is a transistor for precharging a node A. The PMOS transistor PM 1 puts a source drain path between a source connected to a voltage supply terminal Vcc 1 and a drain connected to the node A in a conduction (on) state or a non-conduction (off) state based on the signal CPP inputted to a gate.

An N-channel MOS transistor (described as an NMOS transistor hereafter) NM 1 has its gate connected to the X output terminal of the comparison portion 2A. The NMOS transistor NM 1 puts a source drain path between a source connected to a drain of an NMOS transistor NM 2 described later and a drain connected to the node A in the on state or the off state based on the signal X inputted to the gate. A first discharge portion is configured by the transistors NM 1 and NM 2.

The NMOS transistor NM 2 puts a source drain path between a source connected to a reference potential terminal Vo 1 and a drain connected to the source of the NMOS transistor NM 1 in the on state or the off state based on the signal CPP inputted to the gate.

The PMOS transistor PM 1, NMOS transistor NM 1 and NMOS transistor NM 2 configuring a first live part are cascade-arranged between the voltage supply terminal Vcc 1 and the reference potential terminal Vo 1. To be more precise, the source drain path of the PMOS transistor PM 1 is connected between the voltage supply terminal Vcc 1 and the node A, the source drain path of the NMOS transistor NM 1 is connected between the node A and the drain of the NMOS transistor NM 2, and the source drain path of the NMOS transistor NM 2 is connected between the source of the NMOS transistor NM 1 and the reference potential terminal Vo 1.

The NMOS transistor NM 1 and NMOS transistor NM 2 may also be connected by replacing mutual placement in the configuration.

The PMOS transistor PM 2 configuring a second live part puts a source drain path between a source connected to a voltage supply terminal Vcc 2 and a drain connected to a node B in the on state or the off state based on a potential level of the node A connected to the gate. The PMOS transistor PM 2 is put in the on state in the case where the potential of the node A is at the L level, and sets the node B to an H level.

An NMOS transistor NM 3 puts a source drain path between a source connected to a drain of an NMOS transistor NM 4 described later and a drain connected to the node B in the on state or the off state based on the signal CPP inputted to the gate. A second discharge portion is configured by the transistors NM 3 and NM 4.

The NMOS transistor NM4 has its gate connected to the Y output terminal of a comparison portion 2B. The NMOS transistor NM4 puts a source drain path between a source connected to a reference potential terminal Vo 2 and a drain connected to the source of the NMOS transistor NM 3 in the on state or the off state based on the signal Y inputted to the gate.

The PMOS transistor PM 2, NMOS transistor NM 3 and NMOS transistor NM 4 are cascade-arranged between the voltage supply terminal Vcc 2 and the reference potential terminal Vo 2. To be more precise, the source drain path of the PMOS transistor PM 2 is connected between the voltage supply terminal Vcc 2 and the node B, the source drain path of the NMOS transistor NM 3 is connected between the node B and the drain of the NMOS transistor NM 4, and the source drain path of the NMOS transistor NM 4 is connected between the source of the NMOS transistor NM 3 and the reference potential terminal Vo 2.

The NMOS transistor NM 3 and NMOS transistor NM 4 may also be connected by replacing mutual placement in the configuration.

An output state maintaining portion 3A of the flip-flop circuit 3 includes an inverter INV 1 and an inverter INV 2 having the input terminal of one thereof connected to the output terminal of the other respectively. The input terminal of the inverter INV 1 is connected to the node B while the output terminal thereof is connected to the QB output terminal. The output state maintaining portion 3A having such a configuration has a function of maintaining the signal level of the signals Q and QB at the electric potential of the node B.

The node B of the flip-flop circuit 3 is connected to the Q output terminal on the data output side so as to output the signal Q.

Figure 6:
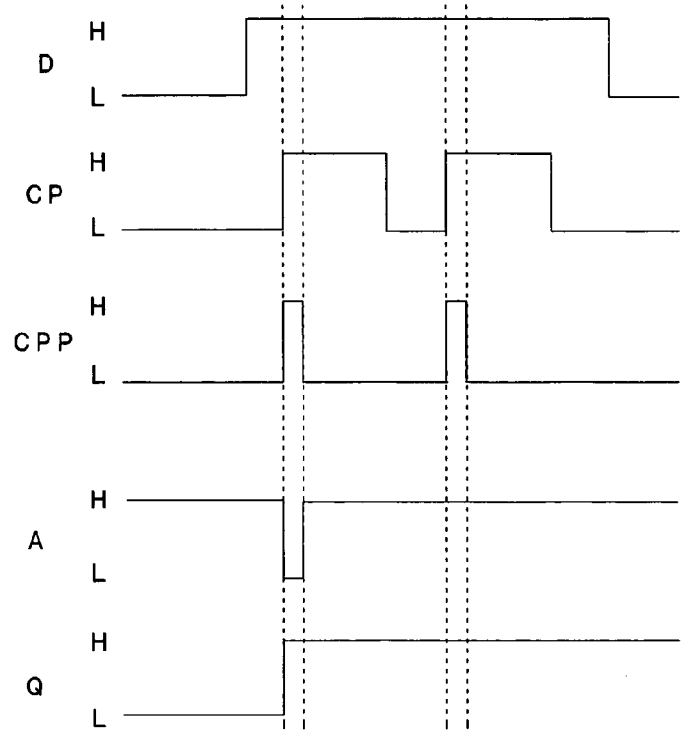
FIG. 6 is an operation timing chart of the semiconductor integrated circuit device of FIG. 3.

Next, a description will be given as to the operation of the semiconductor integrated circuit device 1 according to this embodiment, that is, the case of using the flip-flop circuit 3 shown in FIG. 3 as a concrete circuit configuration for instance. FIG. 6 is an operation timing chart of the semiconductor integrated circuit device of FIG. 3. The operation of the flip-flop circuit 3 described below is performed based on the timing chart shown in FIG. 6.

The comparison portion 2A outputs the signal X to the gate of the NMOS transistor NM 1 based on the comparison result of the signals D and QB. The comparison portion 2B outputs the signal Y to the gate of the NMOS transistor NM 4 based on the comparison result of the signals DB and Q.

The node A is precharged before loading the signals X and Y. To be more precise, the PMOS transistor PM 1 is turned on in a period in which the signal CPP inputted to the gate is L-level (also referred to as a precharge period hereafter) to be conducting between the node A and the voltage supply terminal Vcc 1 so as to precharge the node A. If the node A is precharged, both the PMOS transistor PM 2 and NMOS transistor NM 3 are put in the off state. For that reason, the electric potential of the node B is maintained by the output state maintaining portion 3A. To be more specific, the signals Q and QB are kept in a currently outputted state based on the electric potential of the node B.

If the signal CPP becomes H-level thereafter (the H-level period of the signal CPP is also referred to as a transitional period hereafter), the source drain path of the PMOS transistor PM 1 becomes off while the source drain paths of the NMOS transistor NM 2 and NMOS transistor NM 3 are turned on. Thus, the node B gets to the level according to the signals X and Y.

To be more specific, in the case where the signal X is H-level and the signal Y is L-level, both the NMOS transistor NM 1 and NMOS transistor NM 2 are turned on so as to be conducting between the node A and the reference potential terminal Vo 1 as a predetermined path which the state transition current passes through. Thus, the electric charge precharged on the node A is discharged, the PMOS transistor PM 2 is turned on, and the node B is conducting with the voltage supply terminal Vcc 2 to become H-level.

In the case where the signal X is L-level and the signal Y is H-level, the NMOS transistor NM 1 is put in the off state so that the electric potential of the node A is kept H-level. In this case, the PMOS transistor PM 2 is put in the off state while both the NMOS transistor NM 3 and NMOS transistor NM 4 are turned on. Thus, the node B is conducting with the reference potential terminal Vo 2 to become L-level.

In the case where both the signals X and Y are L-level, the PMOS transistor PM 2 and NMOS transistor NM 4 as well as the NMOS transistor NM 1 are put in the off state. For that reason, as described above, the electric potential of the node B is maintained by the output state maintaining portion 3A.

Therefore, in the case where both the signals X and Y are L-level, the flip-flop circuit 3 shown in FIG. 3 has the electric potentials of both the nodes A and B maintained so as to consequently reduce the power consumption.

Figure 7:
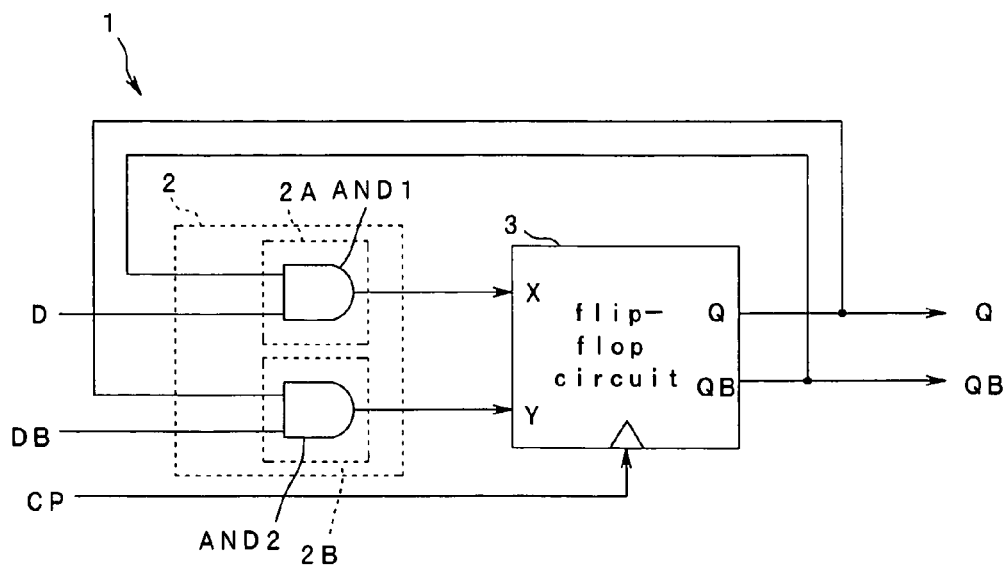
FIG. 7 is a block diagram showing an example of the configuration of a comparator of the semiconductor integrated circuit device according to the embodiment of the present invention.
Figure 8:
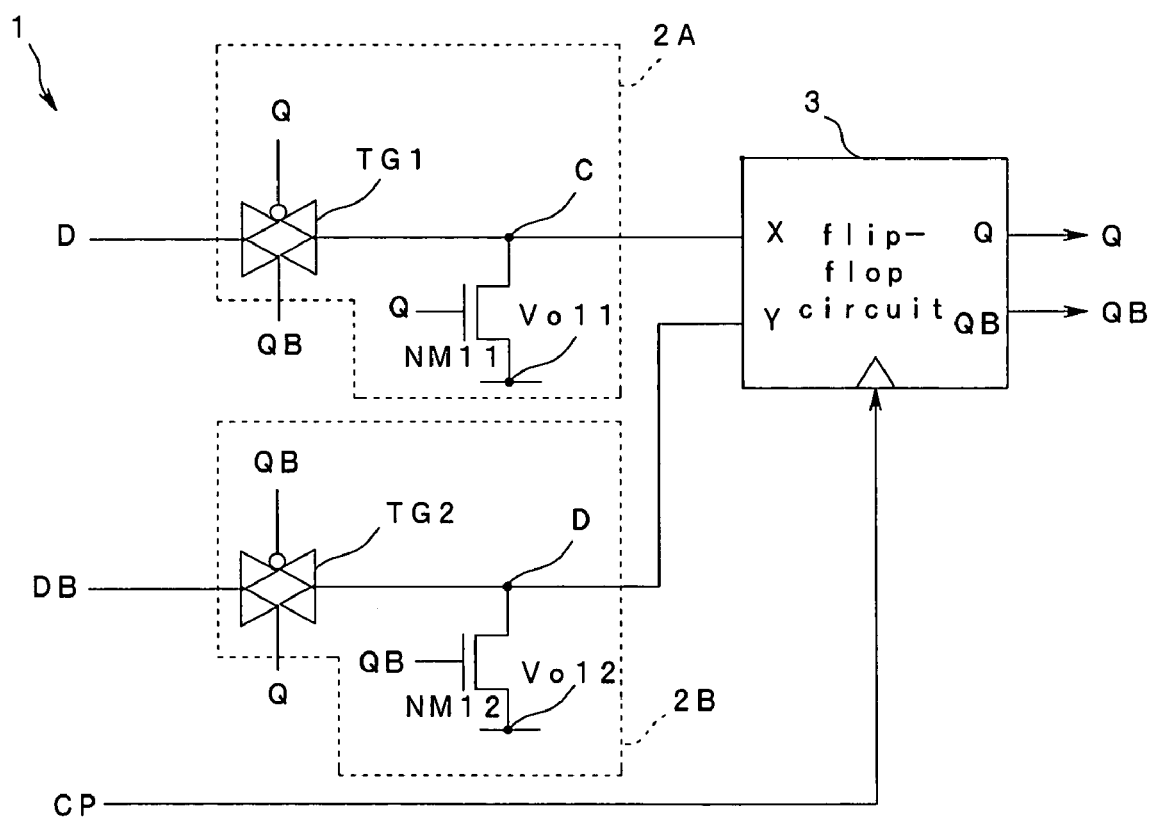
FIG. 8 is a diagram showing an example of the concrete circuit configuration of the comparator of FIG. 7.

As for the semiconductor integrated circuit device 1 of this embodiment, the comparison portions 2A and 2B configuring the comparator 2 includes an AND logical circuit AND 1 and an AND logical circuit AND 2 as shown in FIG. 7 respectively. FIG. 7 is a block diagram showing an example of the configuration of the comparator of the semiconductor integrated circuit device according to the embodiment of the present invention. Furthermore, the AND logical circuits AND 1 and AND 2 have the circuit configuration shown in FIG. 8 as a concrete circuit configuration for instance. FIG. 8 is a diagram showing an example of the concrete circuit configuration of the comparator of FIG. 7.

The comparison portion 2A includes a transmission gate TG 1 and an NMOS transistor NM 11. The transmission gate TG 1 has its input terminal connected to the D input terminal and its output terminal connected to the X input terminal. The signal QB is inputted to a positive phase control terminal while the signal Q is inputted to a negative phase control terminal. For that reason, the transmission gate TG 1 is turned on to pass the signal D through the X input terminal in the case where the signal QB is H-level for instance.

The NMOS transistor NM 11 puts a source drain path between a source connected to a reference potential terminal Vo 11 and a drain connected to a node C shown in FIG. 8 in the on state or the off state based on the signal Q inputted from the Q input terminal connected to the gate.

For instance, in the case where the signal QB is H-level, that is, the signal Q is L-level, the NMOS transistor NM 11 is put in the off state so as to output the signal D outputted from the transmission gate TG 1 to the X input terminal. Meanwhile, in the case where the signal QB is L-level, that is, the signal Q is H-level, the NMOS transistor NM 11 is in the on state while the transmission gate TG 1 is in the off state. In this case, the signal X inputted to the X input terminal is L-level.

The comparison portion 2A of FIG. 8 performs the operation described above and thus has a function as the AND logical circuit for having the signals D and QB inputted.

The comparison portion 2B includes a transmission gate TG 2 and an NMOS transistor NM 12.

The transmission gate TG 2 has its input terminal connected to the DB input terminal and its output terminal connected to the Y input terminal. The signal Q is inputted to the positive phase control terminal while the signal QB is inputted to the negative phase control terminal. For that reason, the transmission gate TG 2 is turned on to pass the signal DB through the Y input terminal in the case where the signal Q is H-level for instance.

The NMOS transistor NM 12 puts a source drain path between a source connected to a reference potential terminal Vo 12 and a drain connected to a node D shown in FIG. 8 in the on state or the off state based on the signal QB inputted from the QB input terminal connected to the gate.

For instance, in the case where the signal QB is L-level, that is, the signal Q is H-level, the NMOS transistor NM 12 is put in the off state so as to output the signal DB outputted from the transmission gate TG 2 to the Y input terminal. Meanwhile, in the case where the signal QB is H-level, that is, the signal Q is L-level, the NMOS transistor NM 12 is in the on state while the transmission gate TG 2 is in the off state. In this case, the signal Y inputted to the Y input terminal is L-level.

The comparison portion 2B performs the operation described above and thus has a function as the AND logical circuit for having the signals DB and Q inputted.

The comparator 2 shown in FIG. 8 is configured by the AND logical circuits AND 1 and AND 2 using the transmission gate TG 1 and transmission gate TG 2. The AND logical circuit of this embodiment uses three transistors. For that reason, it is possible, as to the comparator 2 shown in FIG. 8, to reduce the number of the transistors used therein in comparison to the AND logical circuit consisting of six transistors in general. The three transistors can be configured in a size smaller than the transistors configuring a discharge control circuit disclosed in Nonpatent Document 1. For that reason, the semiconductor integrated circuit device 1 adopting the comparator 2 having the circuit configuration shown in FIG. 8 can have its circuit size reduced while allowing high-speed operation.

Figure 9:
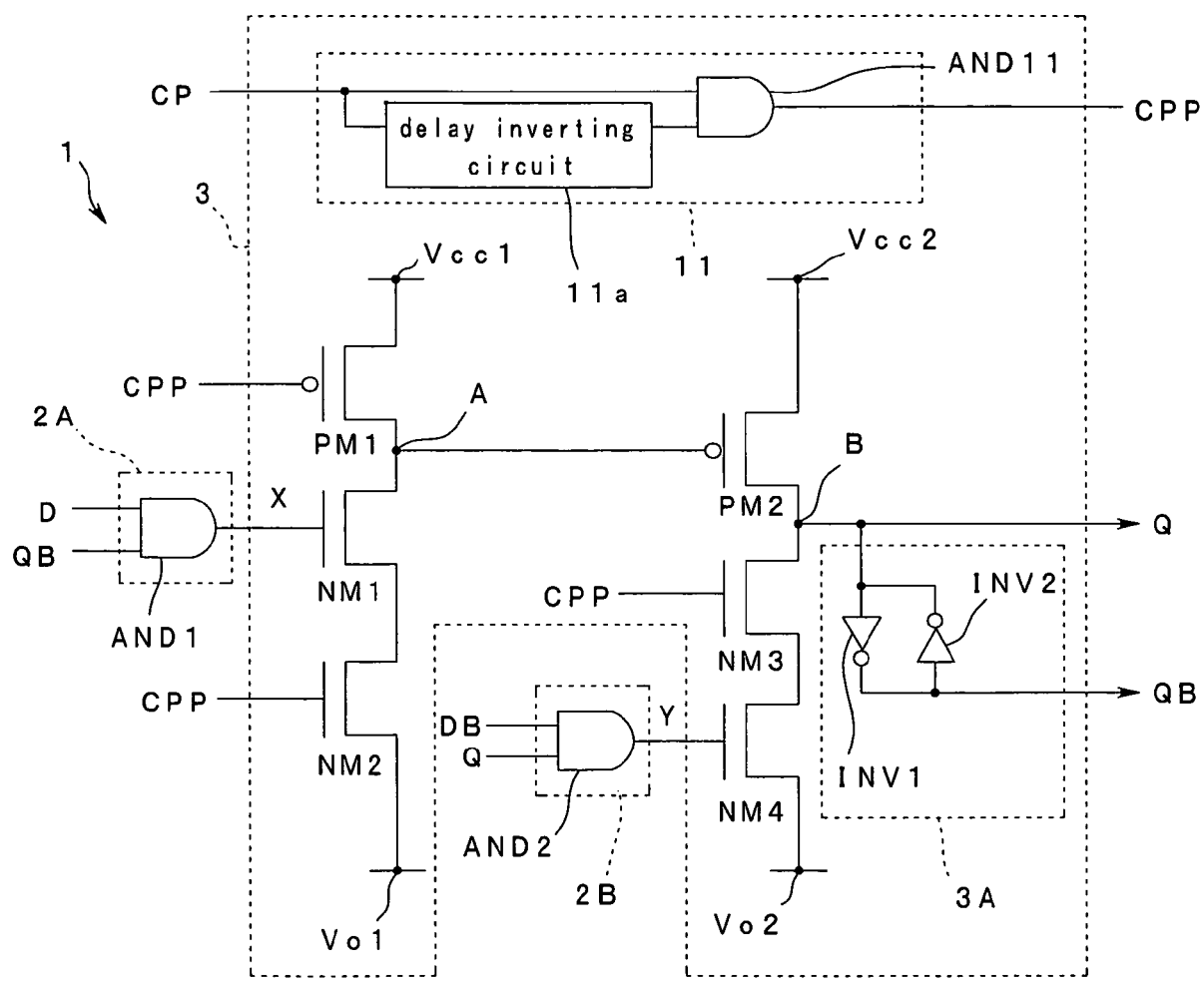
FIG. 9 is a diagram showing the circuit configuration in the case of adopting the flip-flop circuit shown in FIG. 3 on the semiconductor integrated circuit device including the comparator shown in FIG. 7.

The semiconductor integrated circuit device 1 having the comparison portions 2A and 2B consisting of the AND logical circuits AND 1 and AND 2 shown in FIG. 7 may adopt the flip-flop circuit 3 shown in FIG. 3 as its flip-flop circuit 3 for instance. FIG. 9 is a diagram showing the circuit configuration in the case of adopting the flip-flop circuit shown in FIG. 3 on the semiconductor integrated circuit device including the comparator shown in FIG. 7. In that case, the semiconductor integrated circuit device 1 has the circuit configuration shown in FIG. 9. In the flip-flop circuit 3 shown in FIG. 9, the short pulse generation circuit 11 includes a delay inverting circuit 11a for outputting the signal CP by delaying and inverting it and an AND logical circuit AND 11 for generating and outputting the signal CPP based on the signal CP and the output of the delay inverting circuit 11a.

The action and detailed operation of the semiconductor integrated circuit device 1 shown in FIG. 9 are included in the contents of the above description relating to FIG. 3, and so a detailed description thereof will be omitted. For that reason, as with the semiconductor integrated circuit device 1 shown in FIG. 3, the semiconductor integrated circuit device 1 shown in FIG. 9 can have the electric potentials of both the nodes A and B maintained in the case where both the signals X and Y are L-level so as to consequently reduce the power consumption.

Figure 10:
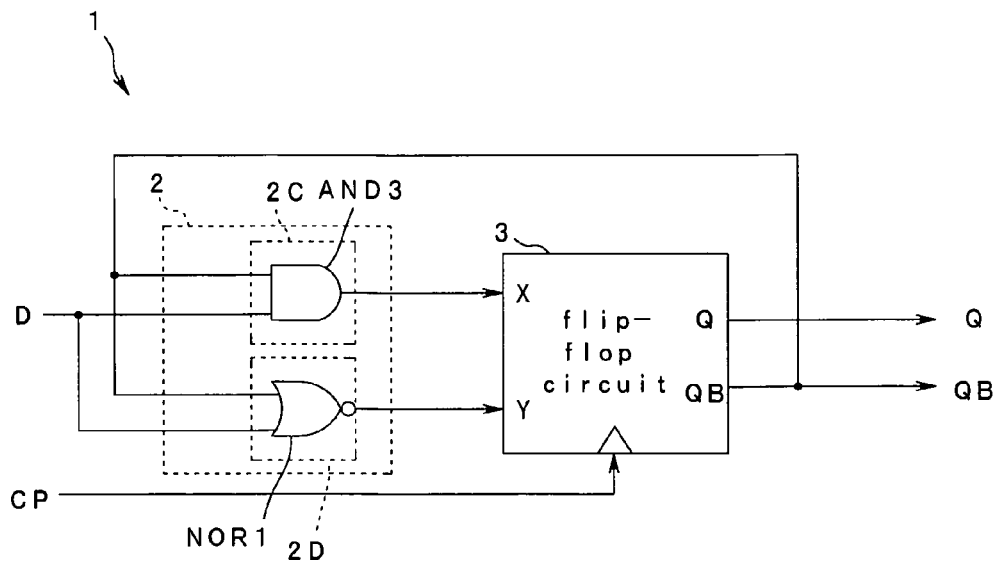
FIG. 10 is a block diagram showing a configuration different from FIGS. 1 and 7 of the semiconductor integrated circuit device according to the embodiment of the present invention.
Figure 11:
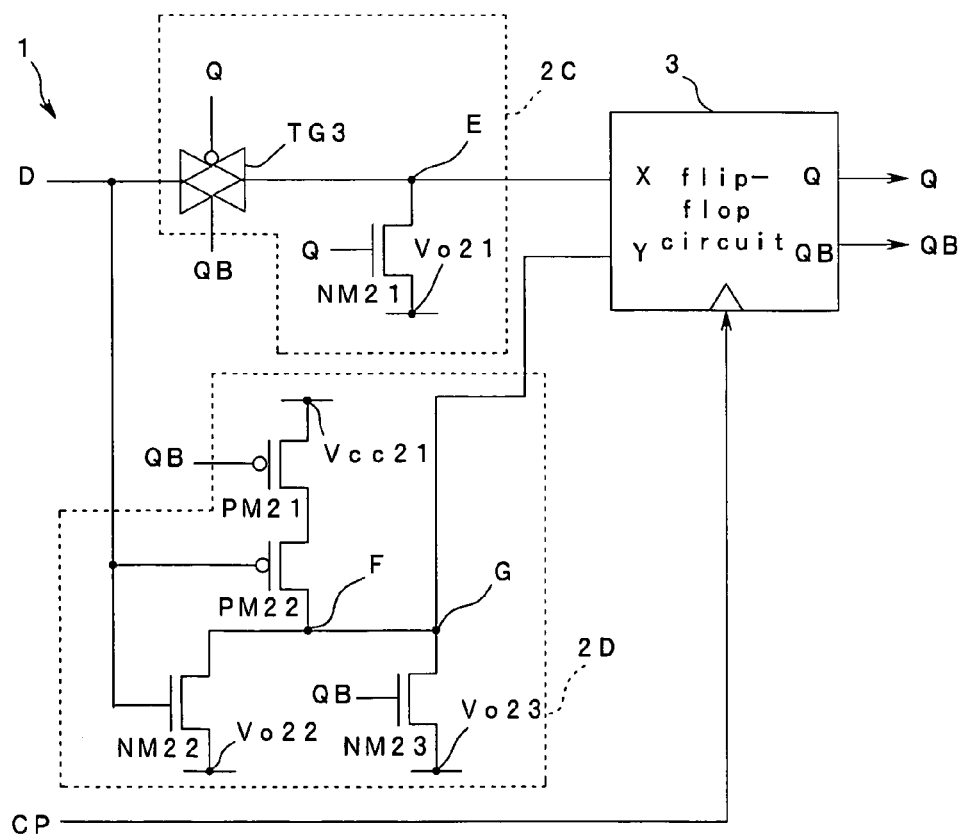
FIG. 11 is a diagram showing an example of the concrete circuit configuration of the comparator of the semiconductor integrated circuit device of FIG. 10.

The comparator 2 of the semiconductor integrated circuit device 1 of this embodiment may be configured by the circuit configuration without using the signal DB for instance. FIG. 10 is a block diagram showing a configuration different from FIGS. 1 and 7 of the semiconductor integrated circuit device according to the embodiment of the present invention. In this case, as shown in FIG. 10 for instance, the comparator 2 includes a comparison portion 2C configured by an AND logical circuit AND 3 and a comparison portion 2D configured by a NOR logical circuit NOR 1. Furthermore, the AND logical circuit AND 3 and NOR logical circuit NOR 1 have the circuit configuration shown in FIG. 11 as their concrete circuit configuration for instance. FIG. 11 is a diagram showing an example of the concrete circuit configuration of the comparator of the semiconductor integrated circuit device of FIG. 10.

The comparison portion 2C shown in FIG. 11 includes a transmission gate TG 3 and an NMOS transistor NM 21. The transmission gate TG 3 has its input terminal connected to the D input terminal and its output terminal connected to the X input terminal. The signal QB is inputted to the positive phase control terminal while the signal Q is inputted to the negative phase control terminal. For that reason, the transmission gate TG 3 is turned on to pass the signal D through the X input terminal in the case where the signal QB is H-level for instance.

The NMOS transistor NM 21 puts a source drain path between a source connected to a reference potential terminal Vo 21 and a drain connected to a node E shown in FIG. 11 in the on state or the off state based on the signal Q inputted from the Q input terminal connected to the gate.

For instance, in the case where the signal QB is H-level, that is, the signal Q is L-level, the NMOS transistor NM 21 is put in the off state so as to output the signal D outputted from the transmission gate TG 3 to the X input terminal. In the case where the signal QB is L-level, that is, the signal Q is H-level, the NMOS transistor NM 21 is in the on state while the transmission gate TG 3 is in the off state. In this case, the signal X inputted to the X input terminal is L-level.

The comparison portion 2C performs the operation described above and thus has a function as the AND logical circuit for having the signals D and QB inputted.

The comparison portion 2D includes a PMOS transistor PM 21, a PMOS transistor PM 22, an NMOS transistor NM 22 and an NMOS transistor NM 23.

The PMOS transistor PM 21 puts a source drain path between a source connected to a voltage supply terminal Vcc 21 and a drain connected to a source of the PMOS transistor PM 22 in the on state or the off state based on the signal QB inputted from the QB input terminal connected to the gate.

The PMOS transistor PM 22 puts a source drain path between a source connected to a drain of the PMOS transistor PM 21 and a drain connected to a drain of the NMOS transistor NM 22 in the on state or the off state based on the signal D inputted from the D input terminal connected to the gate.

The PMOS transistor PM 21 and PMOS transistor PM 22 are cascade-arranged between the voltage supply terminal Vcc 21 and a node F.

The NMOS transistor NM 22 puts a source drain path between a source connected to a reference potential terminal Vo 22 and a drain connected to the Y input terminal of the flip-flop circuit 3 in the on state or the off state based on the signal D inputted from the D input terminal connected to the gate.

The NMOS transistor NM 23 puts a source drain path between a source connected to a reference potential terminal Vo 23 and a drain connected to a drain of the NMOS transistor NM 22 in the on state or the off state based on the signal QB inputted from the QB input terminal connected to the gate.

For instance, in the case where the signal QB is L-level, the PMOS transistor PM 21 is put in the on state while the NMOS transistor NM 23 is put in the off state. And in the case where the signal D is L-level, the PMOS transistor PM 22 is put in the on state while the NMOS transistor NM 22 is put in the off state. In this case, an H-level signal Y is outputted to the flip-flop circuit 3. Meanwhile, if the signal D becomes H-level, the PMOS transistor PM 22 is put in the off state while the NMOS transistor NM 22 is put in the on state. In this case, an L-level signal Y is outputted to the flip-flop circuit 3.

In the case where the signal QB is H-level, the PMOS transistor PM 21 is put in the off state while the NMOS transistor NM 23 is put in the on state. In this case, the L-level signal Y is outputted to the flip-flop circuit 3 irrespective of the state of the signal D.

The comparison portion 2D of FIG. 11 performs the operation described above and thus has a function as the NOR logical circuit for having the signals D and QB inputted.

The semiconductor integrated circuit device 1 consisting of the comparator 2 shown in FIG. 10 may adopt the flip-flop circuit 3 shown in FIG. 9 as its flip-flop circuit 3 for instance.

Figure 12:
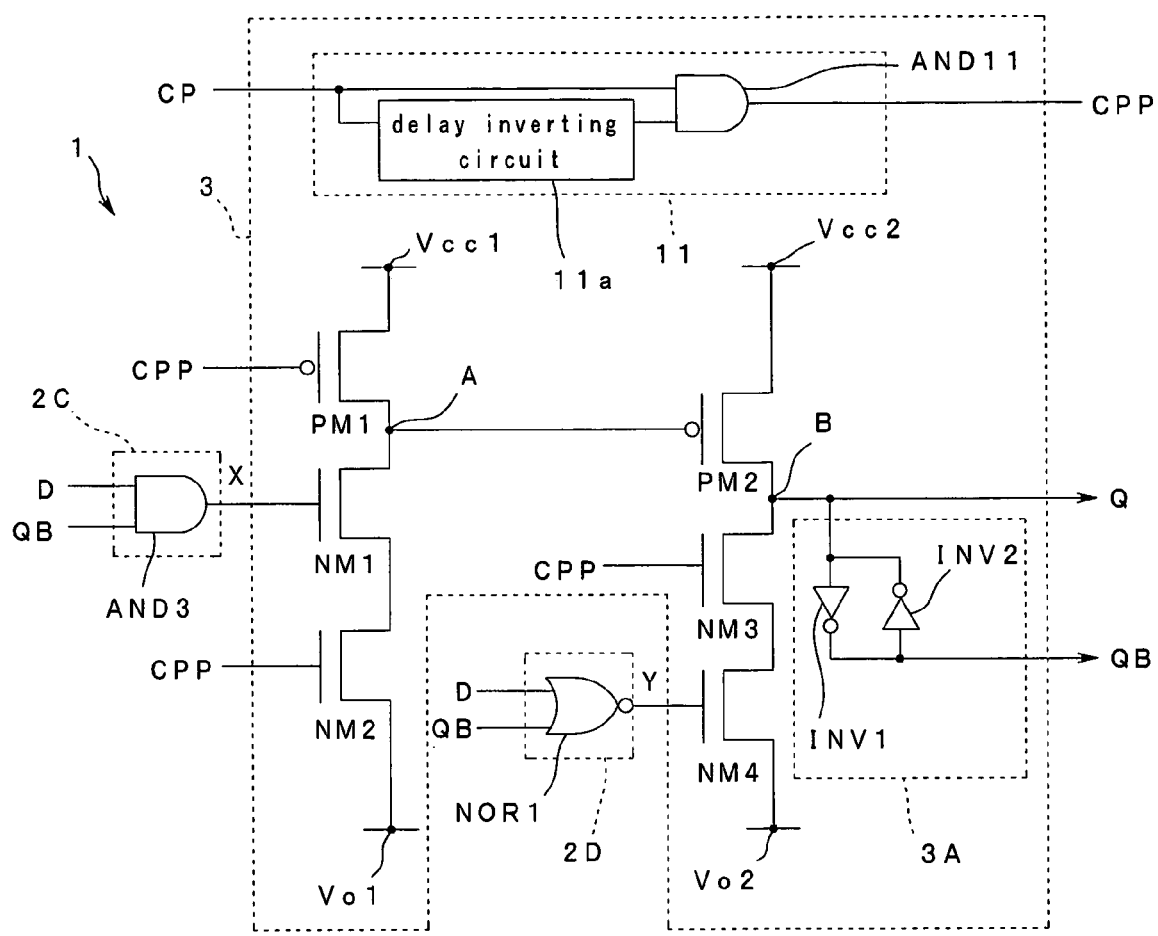
FIG. 12 is a diagram showing the circuit configuration in the case of adopting the flip-flop circuit shown in FIG. 3 on the semiconductor integrated circuit device including the comparator shown in FIG. 10.

FIG. 12 is a diagram showing the circuit configuration in the case of adopting the flip-flop circuit shown in FIG. 3 on the semiconductor integrated circuit device including the comparator shown in FIG. 10. In the flip-flop circuit 3 shown in FIG. 12, the short pulse generation circuit 11 includes a delay inverting circuit 11a for outputting the signal CP by delaying and inverting it and an AND logical circuit AND 11 for generating and outputting the signal CPP based on the signal CP and the output of the delay inverting circuit 11a. The action and detailed operation of the semiconductor integrated circuit device 1 shown in FIG. 12 are included in the contents of the above description relating to FIG. 3, and so a detailed description thereof will be omitted. As with the semiconductor integrated circuit device 1 shown in FIG. 3, the semiconductor integrated circuit device 1 shown in FIG. 12 can have the electric potentials of both the nodes A and B maintained in the case where both the signals X and Y are L-level so as to consequently reduce the power consumption.

Figure 13:
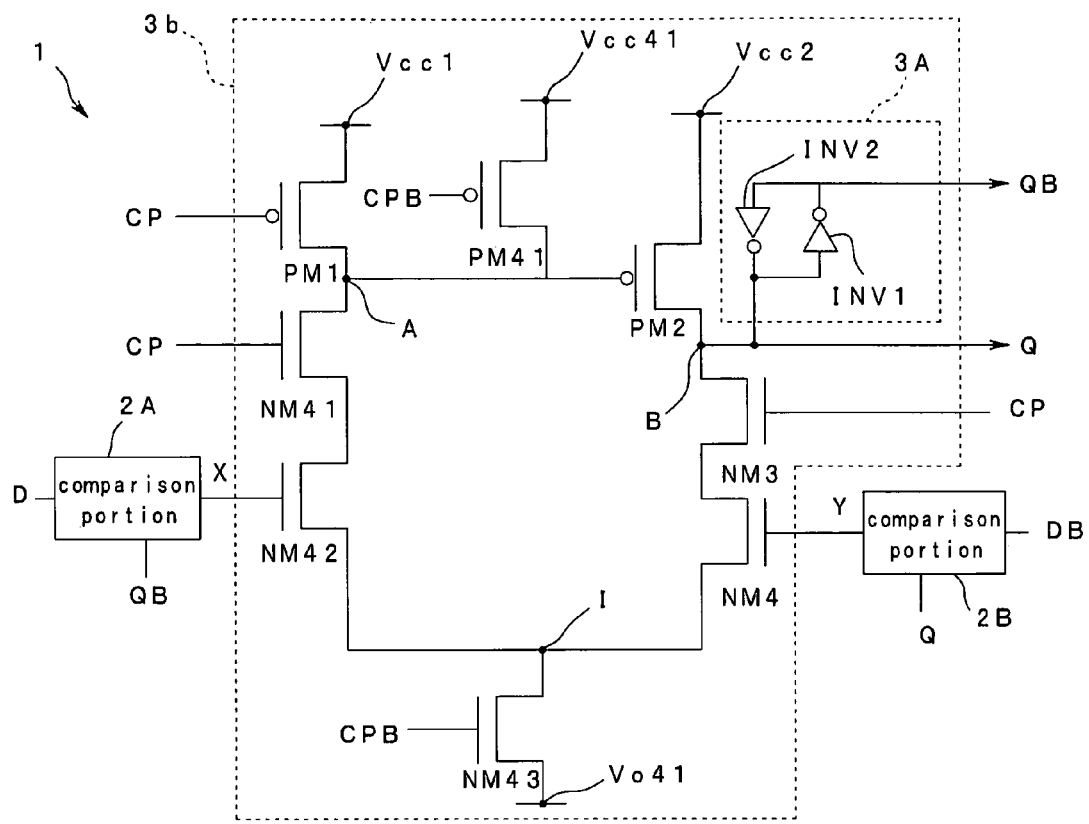
FIG. 13 is a diagram showing an example different from FIG. 3 of the concrete circuit configuration of the flip-flop circuit of the semiconductor integrated circuit device according to the embodiment of the present invention.

Furthermore, as another example, the flip-flop circuit may be configured as a flip-flop circuit 3b shown in FIG. 13 which is partially changed and added for instance. FIG. 13 is a diagram showing an example different from FIG. 3 of the concrete circuit configuration of the flip-flop circuit of the semiconductor integrated circuit device according to the embodiment of the present invention.

The flip-flop circuit 3b shown in FIG. 13 has the short pulse generation circuit 11 provided to the flip-flop circuit 3 eliminated therefrom. An NMOS transistor NM 41 of the flip-flop circuit 3b puts a source drain path between a source connected to a drain of an NMOS transistor NM 42 described later and a drain connected to the node A in the on state or the off state based on the signal CP inputted to the gate.

The NMOS transistor NM 42 has its gate connected to the X output terminal of the comparison portion 2A. The NMOS transistor NM 42 puts a source drain path between a source connected via the node I to a drain of an NMOS transistor NM 43 described later and a drain connected to the source of the NMOS transistor NM 41 in the on state or the off state based on the signal X inputted to the gate.

The NMOS transistor NM 43 puts a source drain path between a source connected to a reference potential terminal Vo 41 and a drain connected to the node I in the on state or the off state based on a signal CPB inputted to the gate. The signal CPB is an inversion signal of the signal CP, which is generated based on the signal CP inputted to a delay inverting circuit configured by an unshown inverter of the flip-flop circuit 3b to be outputted later than the signal CP. The NMOS transistors NM 41 and NM 42 are the transistors configured on a fourth discharge path while the NMOS transistor NM 43 is the transistor configured on a sixth discharge path.

A PMOS transistor PM 41 puts a source drain path between a source connected to a voltage supply terminal Vcc 41 and a drain connected to the node A (the gate of the PMOS transistor PM 2) in the on state or the off state based on the signal CPB inputted to the gate. In the case where the signal CPB is L-level, the PMOS transistor PM 41 is put in the on state and precharges the node A to the H-level. To be more specific, both the PMOS transistor PM 1 and PMOS transistor PM 41 have the function of precharging the node A.

The NMOS transistor NM 4 has its gate connected to the Y output terminal of the comparison portion 2B. The NMOS transistor NM 4 puts a source drain path between a source connected to a drain of the NMOS transistor NM 43 via a node I and a drain connected to the source of the NMOS transistor NM 3 in the on state or the off state based on the signal Y inputted to the gate. The transistors NM 3 and NM 4 are the transistors configured on a fifth discharge path.

Figure 14:
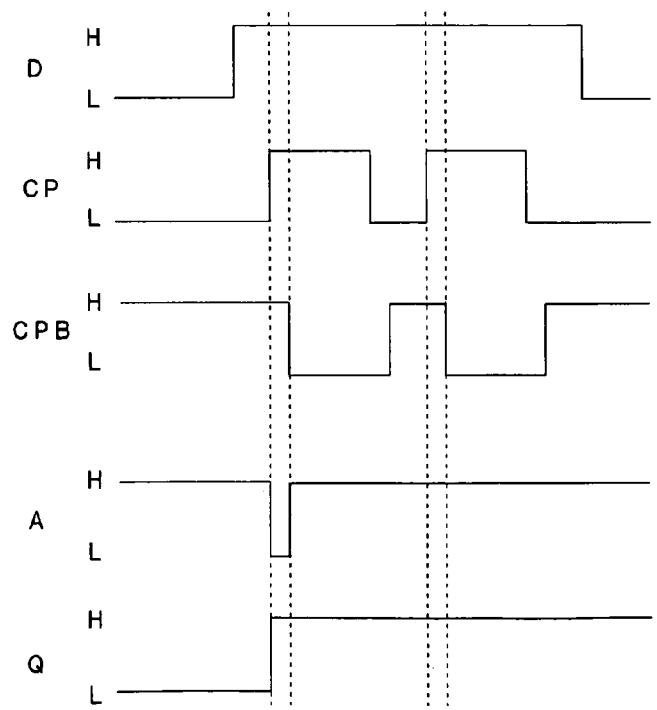
FIG. 14 is an operation timing chart of the semiconductor integrated circuit device of FIG. 13.

Next, a description will be given as to the action of the semiconductor integrated circuit device 1 in the case of adopting the flip-flop circuit 3b shown in FIG. 13 according to this embodiment. FIG. 14 is an operation timing chart of the semiconductor integrated circuit device of FIG. 13. The operation of the flip-flop circuit 3b described below is performed based on the timing chart shown in FIG. 14.

The comparison portion 2A outputs the signal X to the gate of the NMOS transistor NM 42 based on the comparison result of the inputted signals D and QB. The comparison portion 2B outputs the signal Y to the gate of the NMOS transistor NM 4 based on the comparison result of the inputted signals DB and Q.

The node A is precharged before loading the signals X and Y. To be more precise, the PMOS transistor PM 1 is turned on in a period in which the signal CP inputted to the gate is L-level so as to precharge the node A. If the node A is precharged, both the PMOS transistor PM 2 and NMOS transistor NM 3 are put in the off state. In this case, the electric potential of the node B is maintained by the output state maintaining portion 3A. To be more specific, the signals Q and QB are kept in a currently outputted state based on the electric potential of the node B.

If the signal CP becomes H-level thereafter, the signal CPB is outputted later than and inversely to the signal CP from an unshown delay inverting circuit. Therefore, after the signal CP becomes H-level, it keeps H-level just for a predetermined time period as shown in FIG. 14.

In the state (transitional period) in which both the signals CP and CPB are H-level, the PMOS transistor PM 1 and the PMOS transistor PM 41 become off while the NMOS transistor NM 41, NMOS transistor NM 3 and NMOS transistor NM 43 are put in the on state. In this case, the node B gets to the level according to the signal X inputted to the gate of the NMOS transistor NM 42 and the signal Y inputted to the gate of the NMOS transistor NM 4.

To be more specific, in the case where the signal X is H-level and the signal Y is L-level, the NMOS transistor NM 41, NMOS transistor NM 42 and NMOS transistor NM 43 are put in the on state so as to be conducting between the node A and the reference potential terminal Vo 41. In this case, the electric charge precharged on the node A is discharged, the PMOS transistor PM 2 is turned on, and the node B is conducting with the voltage supply terminal Vcc 2 to become H-level.

In the case where the signal X is L-level and the signal Y is H-level, the NMOS transistor NM 42 is put in the off state so that the node A is kept H-level. In this case, the PMOS transistor PM2 is put in the off state while the NMOS transistor NM 3, NMOS transistor NM 4 and NMOS transistor NM 43 are put in the on state. Thus, the node B is conducting with the reference potential terminal Vo 41 to become L-level.

In the case where both the signals X and Y are L-level, the PMOS transistor PM 2 and NMOS transistor NM 4 as well as the NMOS transistor NM 42 are put in the off state. For that reason, the electric potential of the node B is maintained by the output state maintaining portion 3A as previously mentioned.

If the L-level signal CPB is outputted thereafter, the PMOS transistor PM 41 is put in the on state while the NMOS transistor NM 43 is put in the off state. For that reason, the node A is precharged by the voltage supply terminal Vcc 41 to become H-level. If the node A is precharged, the PMOS transistor PM 2 is put in the off state. For that reason, the electric potential of the node B is maintained by the output state maintaining portion 3A.

Therefore, the flip-flop circuit 3b shown in FIG. 13 has the electric potentials of both the nodes A and B maintained in the case where both the signals X and Y are L-level, thereby reducing the power consumption.

And now, the precharge period for rendering the signal CP L-level to precharge the node A is set in a period before the transitional period in which both the signals CP and CPB become H-level. As shown in FIG. 14, the signal CPB is H-level in the precharge period. Therefore, in the precharge period, the NMOS transistor NM 43 is on and the electric charge of the node I is discharged. Thus, no electric charge is accumulated in parasitic capacitance of the node I at a start of the transitional period, and the electric charge of the node A can be passed to the node I at high speed to discharge the node A at high speed immediately after the start of the transitional period. Thus, the node B can be charged in a relatively short time from the start of the transitional period.

Thus, the circuit of FIG. 13 has an advantage of speeding up the transition and speeding up flip-flop operation.

Figure 15:
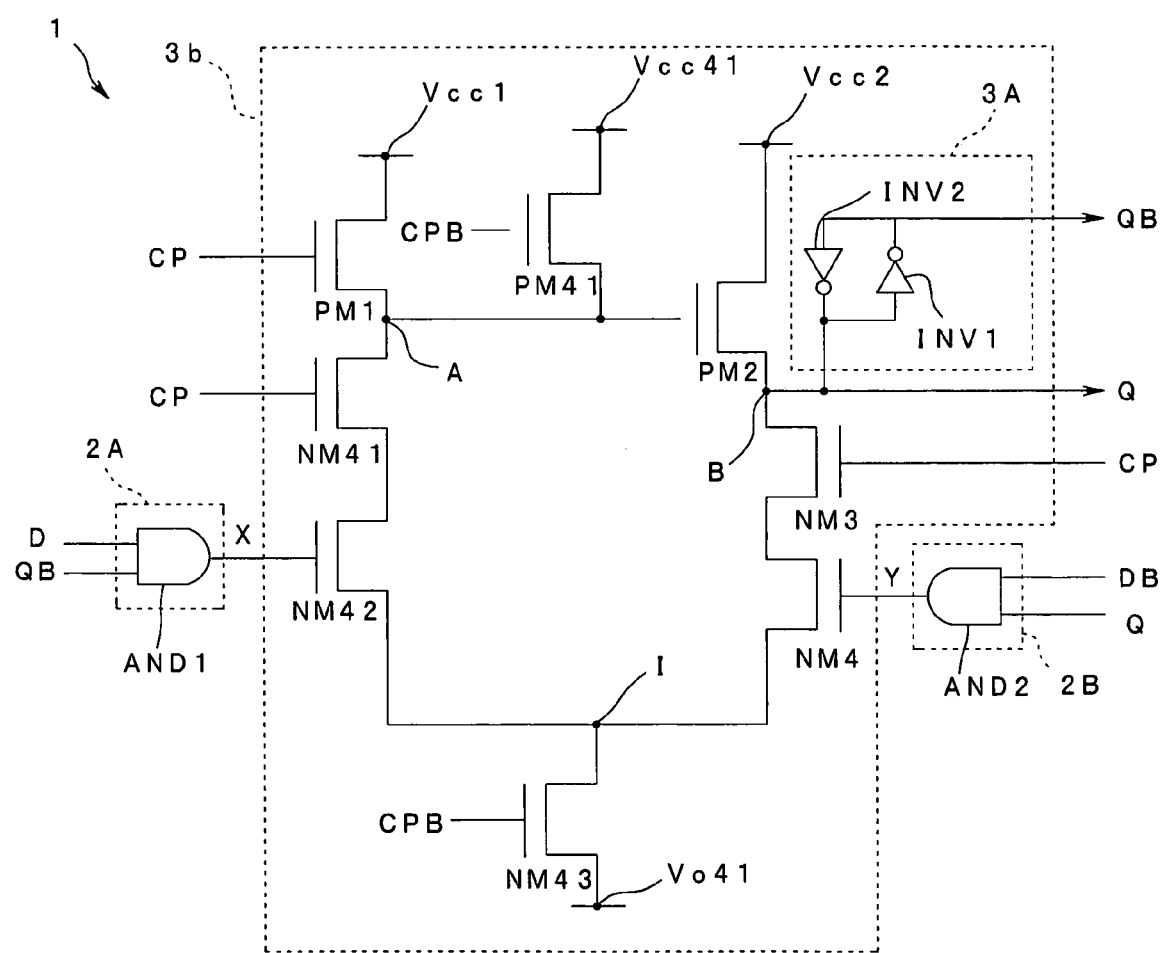
FIG. 15 is a diagram showing an example of the circuit configuration in the case of adopting the comparator shown in FIG. 7 on the semiconductor integrated circuit device including the flip-flop circuit shown in FIG. 13.
Figure 16:
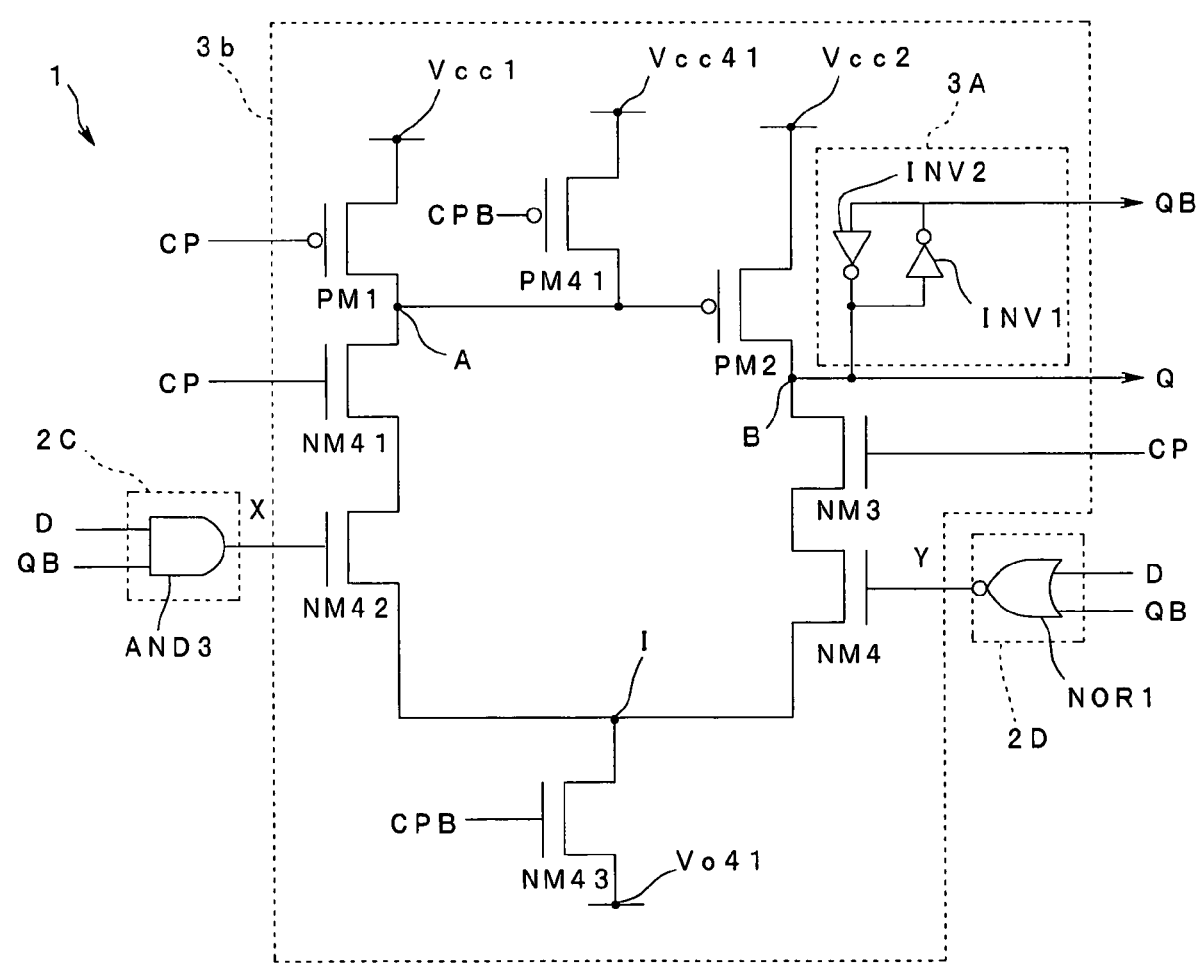
FIG. 16 is a diagram showing an example of the circuit configuration in the case of adopting the comparator shown in FIG. 10 on the semiconductor integrated circuit device including the flip-flop circuit shown in FIG. 13.

The semiconductor integrated circuit device 1 shown in FIG. 13 may also be configured, for instance, as the semiconductor integrated circuit device 1 shown in FIG. 15 in which the comparison portions 2A and 2B consist of the AND logical circuits AND 1 and AND 2, which has approximately the same action and effects. FIG. 15 is a diagram showing an example of the circuit configuration in the case of adopting the comparator shown in FIG. 7 on the semiconductor integrated circuit device including the flip-flop circuit shown in FIG. 13. The semiconductor integrated circuit device 1 shown in FIG. 13 may also be configured, for instance, as the semiconductor integrated circuit device 1 shown in FIG. 16 in which the comparison portion 2C for outputting the signal X to the flip-flop circuit 3b includes the AND logical circuit AND 3 and the comparison portion 2D for outputting the signal Y to the flip-flop circuit 3b includes the NOR logical circuit NOR 1, which has approximately the same action and effects. FIG. 16 is a diagram showing an example of the circuit configuration in the case of adopting the comparator shown in FIG. 10 on the semiconductor integrated circuit device including the flip-flop circuit shown in FIG. 13.

Figure 17:
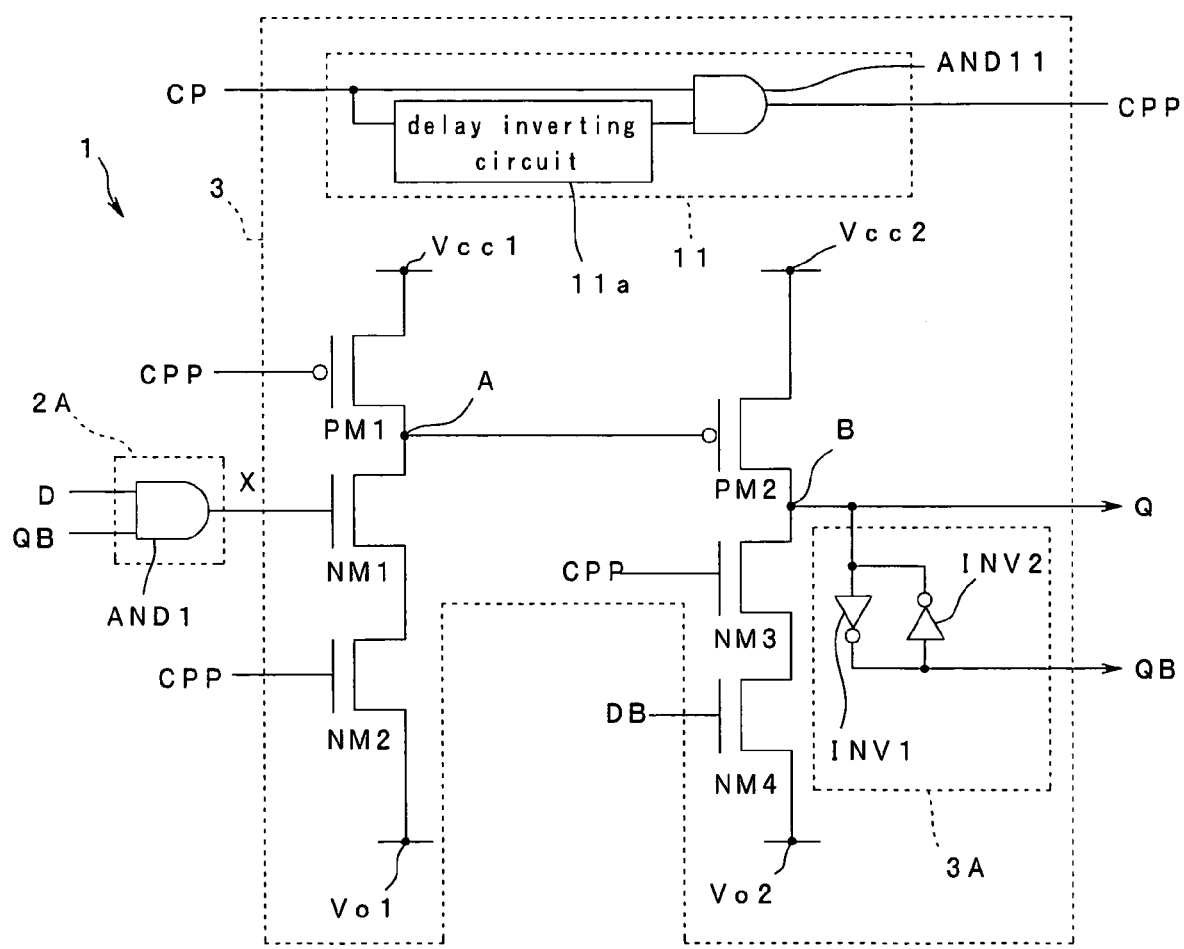
FIG. 17 is a diagram showing the circuit configuration in the case of eliminating one comparison portion of the semiconductor integrated circuit device shown in FIG. 9.

As another example, the semiconductor integrated circuit device 1 shown in FIG. 9 may also be configured, for instance, as the circuit shown in FIG. 17 in which the comparison portion 2B for outputting the signal Y to the gate of the NMOS transistor NM 4 is eliminated to input the signal DB to the gate of the NMOS transistor NM 4. FIG. 17 is a diagram showing the circuit configuration in the case of eliminating one comparison portion of the semiconductor integrated circuit device shown in FIG. 9.

A description will be given as to the operation of the semiconductor integrated circuit device 1 shown in FIG. 17. The comparison portion 2A outputs the signal X to the gate of the NMOS transistor NM 1 based on the comparison result of the inputted signals D and QB. The signal DB is inputted to the gate of the NMOS transistor NM 4.

The node A is precharged before loading the signals X and DB. To be more precise, the PMOS transistor PM 1 is turned on in the period in which the signal CPP inputted to the gate is L-level to be conducting between the node A and the voltage supply terminal Vcc 1 so as to precharge the node A. If the node A is precharged, both the PMOS transistor PM 2 and NMOS transistor NM 3 are put in the off state. For that reason, the electric potential of the node B is maintained by the output state maintaining portion 3A. To be more specific, the signals Q and QB are kept in a currently outputted state based on the electric potential of the node B.

If the signal CPP becomes H-level thereafter, the PMOS transistor PM 1 becomes off while the NMOS transistor NM 2 and NMOS transistor NM 3 are turned on. Thus, the node B gets to the level according to the signals X and DB.

To be more specific, in the case where the signal X is H-level and the signal DB is L-level, both the NMOS transistor NM 1 and NMOS transistor NM 2 are turned on so as to be conducting between the node A and the reference potential terminal Vo 1. Thus, the electric charge precharged on the node A is discharged, then the PMOS transistor PM 2 is turned on and the node B is conducting with the voltage supply terminal Vcc 2 to become H-level.

In the case where the signal X is L-level and the signal DB is H-level, the NMOS transistor NM 1 is put in the off state so that the electric potential of the node A is kept H-level. In this case, the PMOS transistor PM 2 is put in the off state while both the NMOS transistor NM 3 and NMOS transistor NM 4 are turned on. Thus, the node B is conducting with the reference potential terminal Vo 2 to become L-level.

In the case where both the signals X and DB are L-level, the PMOS transistor PM 2 and NMOS transistor NM 4 as well as the NMOS transistor NM 1 are put in the off state. For that reason, the electric potential of the node B is maintained by the output state maintaining portion 3A as previously mentioned.

Therefore, as for the semiconductor integrated circuit device 1 shown in FIG. 17, the electric potentials of both the node A and node B remain unchanged even if the signal CPP changes from L-level to H-level in the case where the signal D is H-level and the signal Q is H-level, that is, the signal X is L-level and the signal DB is L-level. To be more specific, there is neither charge nor discharge, and no redundant internal transition occurs. The electric potentials of both the node A and node B remain unchanged even if the signal CPP changes from L-level to H-level in the case where the signal D is L-level and the signal Q is L-level, that is, the signal X is L-level and the signal DB is H-level. To be more specific, there is neither charge nor discharge, and no redundant internal transition occurs. Consequently, the semiconductor integrated circuit device 1 shown in FIG. 17 can realize power reducing action approximately equal to the semiconductor integrated circuit device 1 shown in FIG. 9 in a smaller circuit size by omitting the comparison portion 2B.

Figure 18:
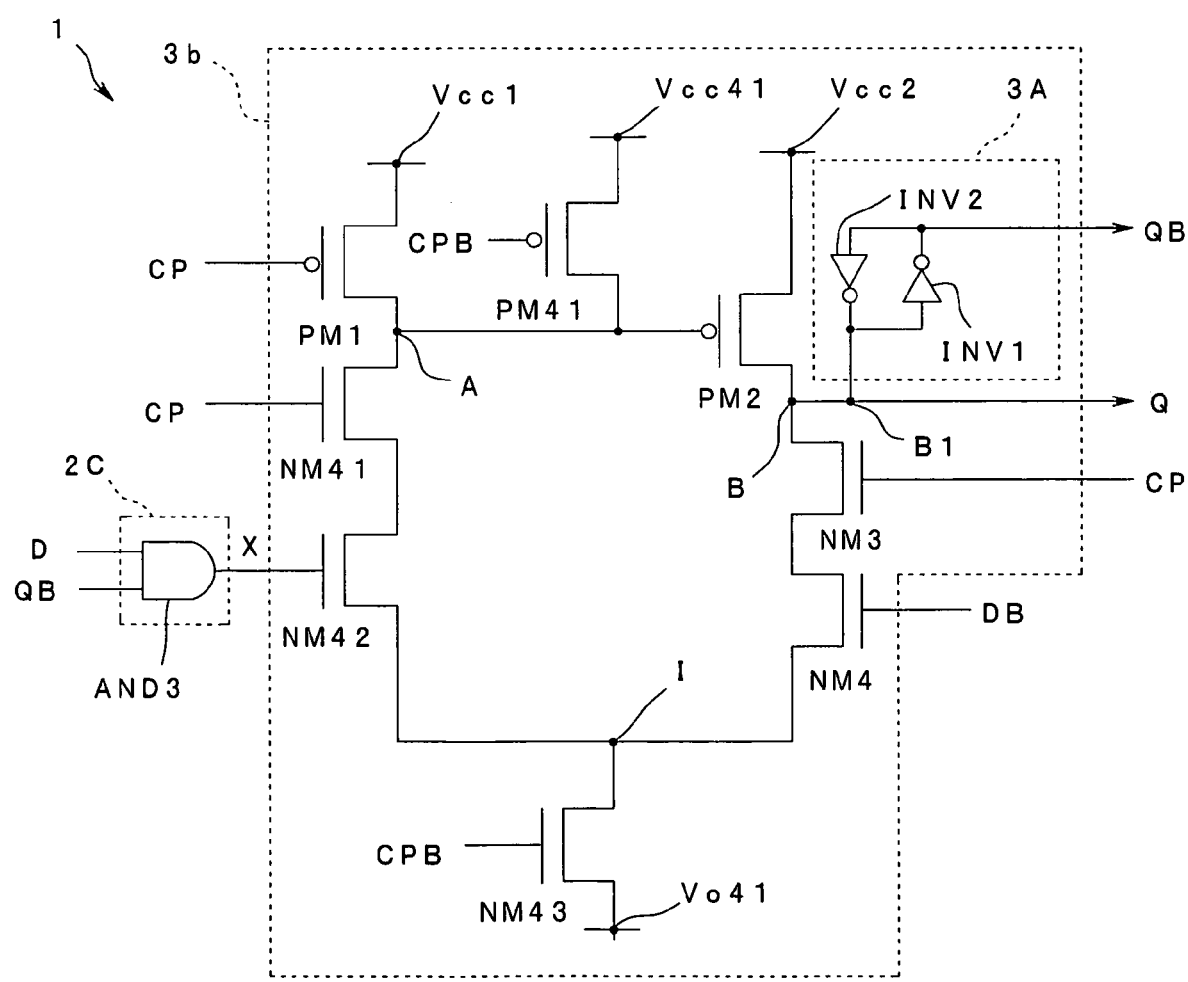
FIG. 18 is a diagram showing the circuit configuration in the case of eliminating one comparison portion of the semiconductor integrated circuit device shown in FIG. 16.

As another example, the semiconductor integrated circuit device 1 shown in FIG. 16 may also be configured, for instance, as the circuit shown in FIG. 18 in which the comparison portion 2D for outputting the signal Y to the gate of the NMOS transistor NM 4 is eliminated to input the signal DB to the gate of the NMOS transistor NM 4. FIG. 18 is a diagram showing the circuit configuration in the case of eliminating one comparison portion of the semiconductor integrated circuit device shown in FIG. 16.

A description will be given as to the operation of the semiconductor integrated circuit device 1 shown in FIG. 18. The comparison portion 2C outputs the signal X to the gate of the NMOS transistor NM 42 based on the comparison result of the inputted signals D and QB. The signal DB is inputted to the gate of the NMOS transistor NM 4.

The node A is precharged before loading the signals X and DB. To be more precise, the PMOS transistor PM 1 is turned on in the period in which the signal CP inputted to the gate is L-level so as to precharge the node A. If the node A is precharged, both the PMOS transistor PM 2 and NMOS transistor NM 3 are put in the off state. For that reason, the electric potential of the node B is maintained by the output state maintaining portion 3A. To be more specific, the signals Q and QB are kept in a currently outputted state based on the electric potential of the node B.

If the signal CP becomes H-level thereafter, the signal CPB is outputted later than and inversely to the signal CP from an unshown delay inverting circuit. Therefore, after the signal CP becomes H-level, it keeps H-level just for a predetermined time period.

In the state in which both the signals CP and CPB are H-level, the PMOS transistor PM 1 and the PMOS transistor PM 41 become off while the NMOS transistor NM 41, NMOS transistor NM 3 and NMOS transistor NM 43 are put in the on state. Thus, the node B gets to the level according to the signal X and the signal DB.

To be more specific, in the case where the signal X is H-level and the signal DB is L-level, the NMOS transistor NM 41, NMOS transistor NM 42 and NMOS transistor NM 43 are put in the on state so as to be conducting between the node A and the reference potential terminal Vo 41. Thus, the electric charge precharged on the node A is discharged, then the PMOS transistor PM 2 is turned on and the node B is conducting with the voltage supply terminal Vcc 2 to become H-level.

In the case where the signal X is L-level and the signal DB is H-level, the NMOS transistor NM 42 is put in the off state so that the node A is kept H-level. In this case, the PMOS transistor PM 2 is put in the off state while the NMOS transistor NM 3, NMOS transistor NM 4 and NMOS transistor NM 43 are put in the on state. Thus, the node B is conducting with the reference potential terminal Vo 41 to become L-level.

In the case where both the signals X and DB are L-level, the PMOS transistor PM 2 and NMOS transistor NM 4 as well as the NMOS transistor NM 42 are put in the off state. For that reason, the electric potential of the node B is maintained by the output state maintaining portion 3A as previously mentioned.

If the L-level signal CPB is outputted thereafter, the PMOS transistor PM 41 is put in the on state while the NMOS transistor NM 43 is put in the off state. For that reason, the node A is precharged by the voltage supply terminal Vcc 41 to become H-level. If the node A is precharged, the PMOS transistor PM 2 is put in the off state. For that reason, the electric potential of the node B is maintained by the output state maintaining portion 3A.

Therefore, as for the semiconductor integrated circuit device 1 shown in FIG. 18, the electric potentials of both the node A and node B remain unchanged even if the signal CP changes from L-level to H-level in the case where the signal D is H-level and the signal Q is H-level, that is, the signal X is L-level and the signal DB is L-level. To be more specific, there is neither charge nor discharge, and no redundant internal transition occurs. The electric potentials of both the node A and node B remain unchanged even if the signal CP changes from L-level to H-level in the case where the signal D is L-level and the signal Q is L-level, that is, the signal X is L-level and the signal DB is H-level. To be more specific, there is neither charge nor discharge, and no redundant internal transition occurs. Consequently, the semiconductor integrated circuit device 1 shown in FIG. 18 can realize power reducing action approximately equal to the semiconductor integrated circuit device 1 shown in FIG. 16 in a smaller circuit size by omitting the comparison portion 2D.

The semiconductor integrated circuit device 1 of this embodiment makes a comparison between a logical value based on the signal level of an input signal and a logical value based on the signal level of an output signal by means of the comparator 2. If determined that the state of the output signal is not changed by the input signal, the semiconductor integrated circuit device 1 of this embodiment generates and outputs the signals X and Y of a combination of the logical values based on the result of the comparison made by the comparator 2, that is, the L-level signal X and L-level signal Y. Thus, the semiconductor integrated circuit device 1 of this embodiment maintains the state of the output signal without discharging the electric charge precharged on the node A of the flip-flop circuit 3 or the flip-flop circuit 3b, that is, without passing the state transition current. Consequently, the semiconductor integrated circuit device 1 of this embodiment can reduce the power consumption more than before.

The semiconductor integrated circuit device 1 of this embodiment realizes the reduction in the power consumption without using a circuit such as a clock control circuit by outputting the signals X and Y for maintaining the state of the signal Q from the comparator 2. The semiconductor integrated circuit device 1 of this embodiment can reduce the power consumption in the flip-flop circuit 3 while hardly affecting clock-output delay and setup time relating to the output state of the signal CP as a trigger signal, that is, without decreasing operation speed of the entire semiconductor integrated circuit device.

Furthermore, the semiconductor integrated circuit device 1 of this embodiment realizes the reduction in the power consumption, for instance, by controlling the potential level for the node A without using a dedicated circuit such as a discharge control circuit cascade-arranged between the source of the NMOS transistor NM 2 and the reference potential terminal Vo 1 in the flip-flop circuit 3 or the flip-flop circuit 3b. For that reason, the semiconductor integrated circuit device 1 of this embodiment can reduce the power consumption without increasing the circuit size.

The circuit configurations of the semiconductor integrated circuit device 1 of this embodiment shown in FIGS. 3, 7, 8, 9, 10, 11, 12, 13, 15, 16, 17 and 18 are just the examples of the concrete circuit configurations. The present invention is not limited only to the above-mentioned circuit configurations. The truth table on the comparator 2 shown in FIG. 4 and the truth table on the flip-flop circuit 3 shown in FIG. 5 show the examples of the respective concrete circuit operations which are not limited only to those of this embodiment. The semiconductor integrated circuit device 1 shown in FIG. 3 can have the NMOS transistors replaced by the PMOS transistors and also have the PMOS transistors replaced by the NMOS transistors for instance. For that reason, the semiconductor integrated circuit device 1 shown in FIG. 3 has the aforementioned power reducing action even in the case where the circuit operation and truth table are changed by the replacement. Thus, as for the semiconductor integrated circuit device 1 of the present invention, the circuit configuration can be changed variously without departing from the scope of the invention as long as it has the same action as that described above.

A table 1 below is the table for describing the effects of the embodiments.

According to the embodiments, the power consumption is unambiguously decided based on a data transition rate (the number of changes in data per input clock (equivalent to the signal CP in the embodiments)). For instance, as to the example of the semiconductor integrated circuit device of FIG. 18, the power consumption is decided according to the data transition rate as shown in the table 1 below. The table 1 below shows an example of using a clock of 1 GHz.

TABLE 1

| Data transition rate | Power [μW] |
|---|---|
| 100% | 40 |
| 50% | 25 |
| 25% | 17 |
| 0% | 9 |

As shown in the table 1, the lower the data transition rate is, the higher the effect of reducing the power consumption becomes as to the embodiments.

Figure 19:
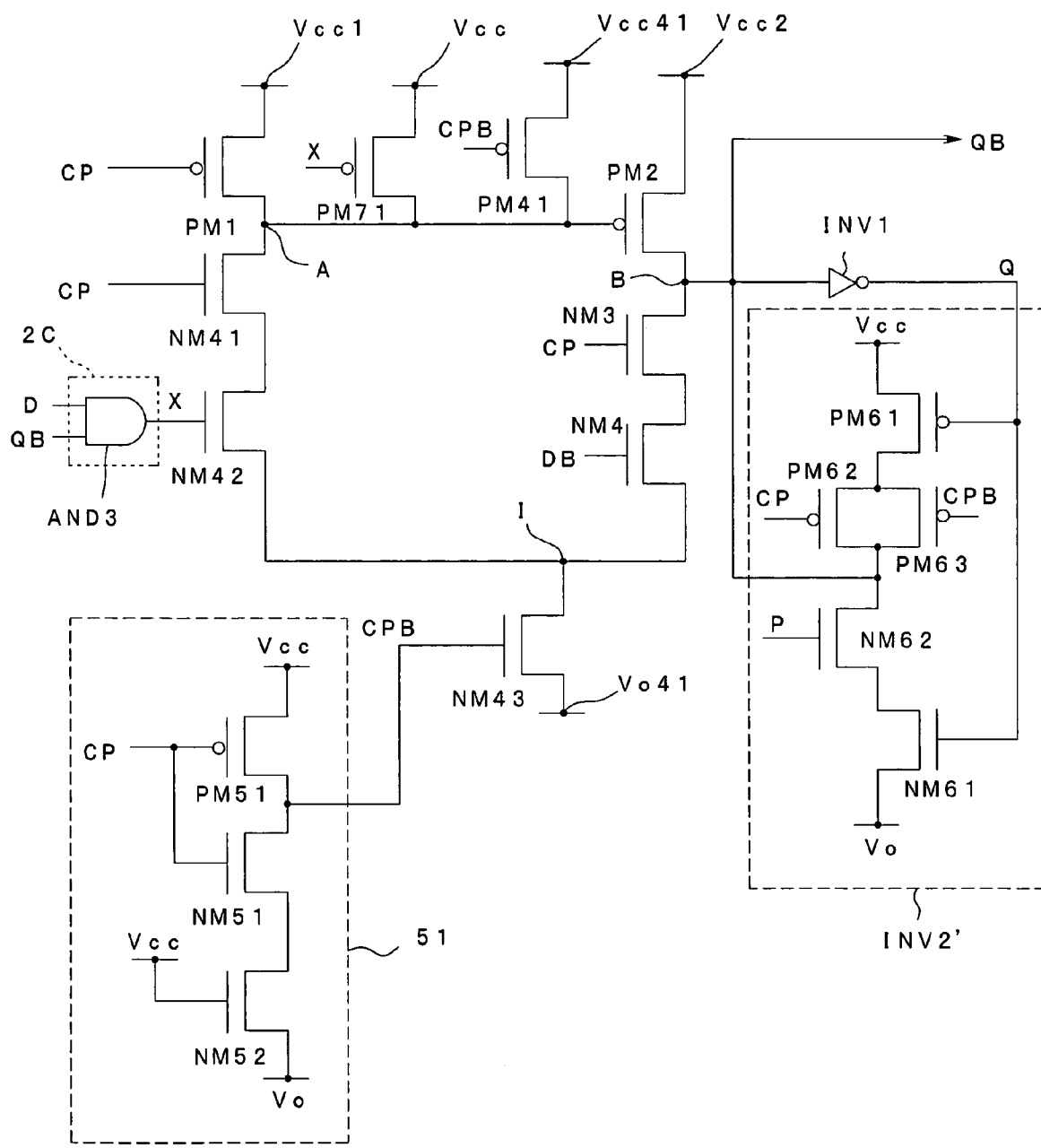
FIG. 19 is a circuit diagram showing another example of the semiconductor integrated circuit device of FIG. 18.

FIG. 19 is a circuit diagram showing another example of the semiconductor integrated circuit device of FIG. 18. In FIG. 19, the same components as those in FIG. 18 are given the same symbols, and a description thereof will be omitted.

The circuit of FIG. 19 is different from the circuit of FIG. 18 in that it adopts a delay inverting circuit 51 as a circuit for generating the signal CPB from the signal CP, adopts an inverter INV 2' as the inverter INV 2 of FIG. 18, and also adopts a PMOS transistor PM 71.

The delay inverting circuit 51 includes a PMOS transistor PM 51 and NMOS transistors NM 51 and NM 52. A source drain path of the transistor PM 51, a source drain path of the transistor NM 51 and a source drain path of the transistor NM 52 are series-connected between the voltage supply terminal Vcc and the reference potential terminal Vo.

The signal CP is given to the gates of the transistors PM 51 and NM 51. Power supply voltage Vcc is applied to the gate of the transistor NM 52. A connection point between the transistors PM 51 and NM 51 is the output terminal of the delay inverting circuit 51, which is connected to the gate of the NMOS transistor NM 43.

The delay inverting circuit 51 thus configured has the transistor PM 51 turned on and the transistor NM 51 turned off in the case where the signal CP is L-level. The transistor NM 52 is constantly on, and the connection point between the transistors PM 51 and NM 51 (output terminal) is H-level.

If the signal CP becomes H-level, the transistor PM 51 is turned off and the transistor NM 51 is turned on while the output terminal transitions to L-level after a predetermined time period according to a time constant defined by the parasitic capacitance and resistance of the transistors NM 51 and NM 52. Thus, the output terminal shifts to L-level after a predetermined delay time from the change of the signal CP from L-level to H-level. To be more specific, the signal CPB as a delay inverting signal of the signal CP appears at the output terminal.

According to such a configuration, the number of stages of charge and discharge (the number of stages of inverters) is small enough to reduce the power consumption. There is also an advantage that the number of necessary transistors is small and so the area thereby occupied is small.

The signal CPB shifts from H-level to L-level according to the time constant by the resistance of the transistor NM 52. To be more specific, a falling edge of the signal CPB is performed slowly according to the time constant, and the signal CPB has not completely fallen even after finishing the transitional period. To be more specific, the transistor NM 43 passes some amount of current even after finishing the transitional period.

And now, if the transitional period is long, there is a possibility that the data may change during the transitional period. Thus, it is necessary to set a relatively short time period as the transitional period. If the transitional period is short, however, there is a possibility that the precharge node may not be completely discharged.

Meanwhile, it is possible, however, to securely discharge the precharge node by adopting the delay inverting circuit 51 of FIG. 19 and thereby having the discharge continued by the transistor NM 43 for a while after finishing the transitional period.

Thus, it is possible, by adopting the delay inverting circuit 51 of FIG. 19, to securely discharge the precharge node in the transitional period so as to improve stability of the operation.

The inverter INV 2' is configured by the PMOS transistors PM 61 to 63 and the NMOS transistors NM 61 and 62. The transistors PM 61 and NM 61 configuring the inverters are provided between the voltage supply terminal Vcc and the reference potential terminal Vo. The output of the inverter INV 1 is given to the gates of the transistors PM 61 and NM 61.

The transistors PM 62, PM 63 and NM 62 for controlling the output state maintaining portion are provided between the transistors PM 61 and NM 61. The source drain paths of the transistors PM 62 and PM 63 are connected in parallel. One end of the source drain paths connected in parallel is connected to the voltage supply terminal Vcc via the source drain path of the transistor PM 61, and the other end is connected to the reference potential terminal Vo via the source drain path of the transistor NM 62 and the source drain path of the transistor NM 61.

The connection point between the source drain paths of the transistors PM 62, PM 63 and the source drain path of the transistor NM 62 is connected to the QB output terminal and the input terminal of the inverter INV 1.

The transistors PM 61 and NM 61 have the signal Q as the output of the inverter INV 1 given to their gates so as to configure the inverters for outputting the signal QB to the QB output terminal. To be more specific, the transistors PM 61 and NM 61 are the two inverters for having the output of each other inputted thereto as with the inverter INV 1. The output state maintaining portion for maintaining the state of the QB output terminal is configured by these inverters.

Meanwhile, an output state maintenance controlling portion for controlling the output state maintaining portion is configured by the transistors PM 62, PM 63 and NM 62. The gate of the transistor PM 62 is supplied with a control signal P which becomes L-level in the transitional period and becomes H-level in the other periods. Thus, the transistor NM 62 is conducting in the periods other than the transitional period and has the conduction blocked in the transitional period.

The transistor PM 62 is turned on in an L-level period of the signal CP, and the transistor PM 63 is turned on in an L-level period of the signal CPB. Therefore, the transistors PM 62 and PM 63 are conducting only in the periods other than the transitional period.

Therefore, in the periods other than the transitional period, state maintaining operation is performed by the output state maintaining portion configured by the transistors PM 61, NM 61 and the inverter INV 1. In the transitional period, the operation of the output state maintaining portion stops so that the state of the QB output terminal is not maintained.

It is possible, by providing the output state maintenance controlling portion, to stop the operation of the output state maintaining portion in the transitional period, facilitate the transition of the QB output terminal and improve stability of the operation.

Furthermore, the circuit of FIG. 19 has the PMOS transistor PM 71 added thereto. The gate of the transistor PM 71 is supplied with the signal X. A precharge node A is charged by the transistor PM 1 in the period in which the signal CP is L-level, and is charged by the transistor PM 41 in the period in which the signal CPB is L-level. It is necessary, in the transitional period, to turn off the transistors PM 1 and PM 41 so as to put the precharge node A in a dischargeable state.

In the case where the signal X is L-level, however, it is not necessary to let the precharge node A discharge. Thus, in the example of FIG. 19, the precharge node A is charged by the transistor PM 71 even in the transitional period in the case where the signal X is L-level.

It is thereby possible to securely keep the precharge node A H-level and obtain a circuit strong as to noise.

Figure 20:
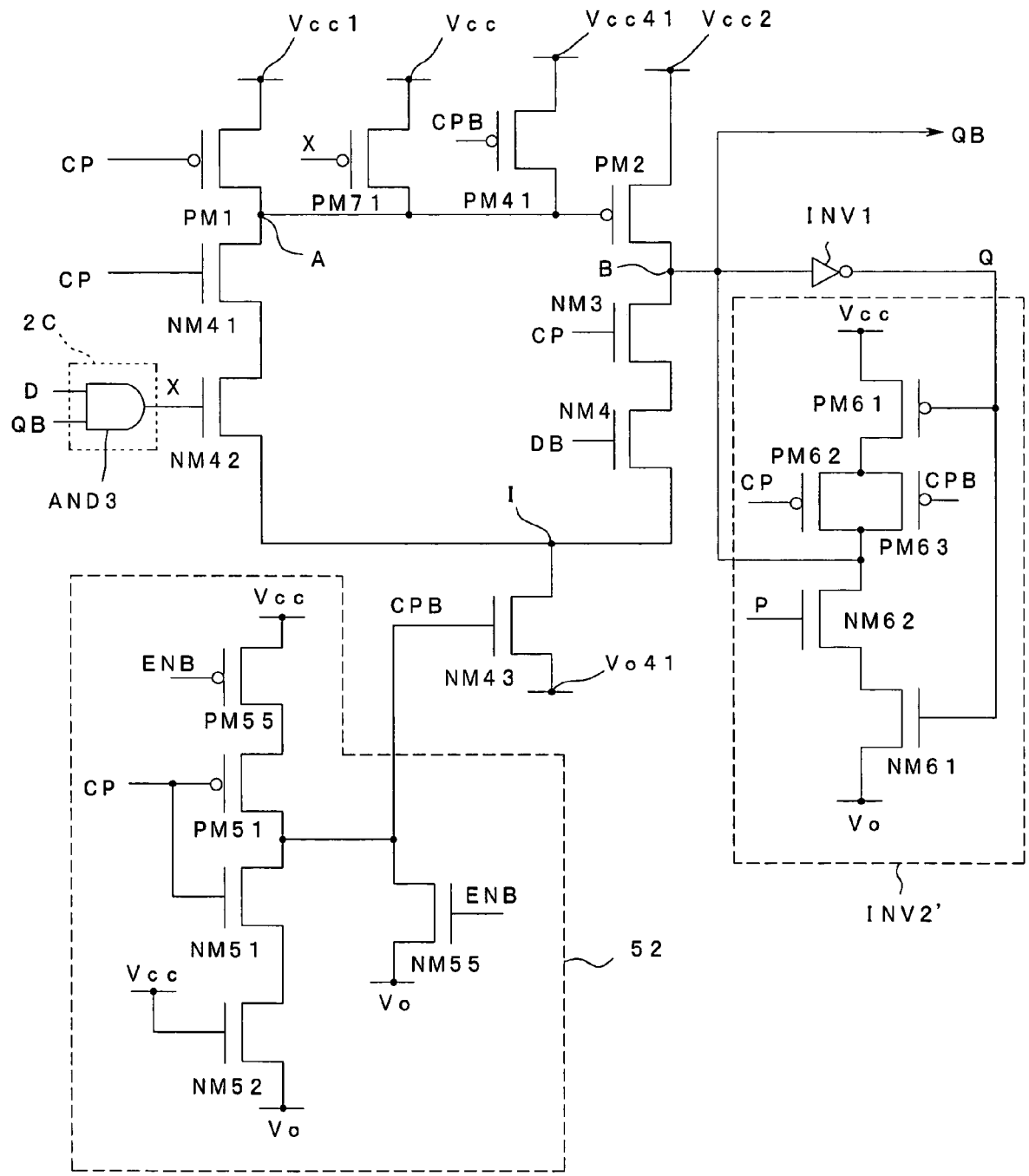
FIG. 20 is a circuit diagram showing a further example of the semiconductor integrated circuit device of FIG. 18.

FIG. 20 is a circuit diagram showing a further example of the semiconductor integrated circuit device of FIG. 18. In FIG. 20, the same components as those in FIG. 19 are given the same symbols, and a description thereof will be omitted.

The example of FIG. 20 is different from the circuit of FIG. 19 only in that it adopts a delay inverting circuit 52 having an enable function instead of the delay inverting circuit 51. The delay inverting circuit 52 has a PMOS transistor PM 55 and an NMOS transistor NM 55 added to the delay inverting circuit 51. The voltage supply terminal Vcc is connected to the transistor PM 51 via a source drain path of the transistor PM 55. The gate of the transistor NM 43 is connected to the reference potential terminal Vo via a source drain path of the transistor NM 55.

The gates of the transistors PM 55 and NM 55 are supplied with an inversion signal ENB of an enable signal EN. An H-level signal ENB turns the transistor PM 55 off and turns the transistor NM 55 on. Thus, the signal CPB keeps L-level while the transistor NM 43 continues to be off. To be more specific, the circuit of FIG. 20 stops the flip-flop operation in this case.

In the case where the signal ENB is L-level, it has the same action as FIG. 19 so that normal flip-flop operation is performed.

In the case of not using the enable signals EN and ENB, redundant internal transition may occur to each of the signals CP even if the data transition rate is 0%. In the configuration of FIG. 20 in comparison, no internal transition occurs and no power is consumed in the H-level period of the signal ENB irrespective of the signal CP.

Figure 21:
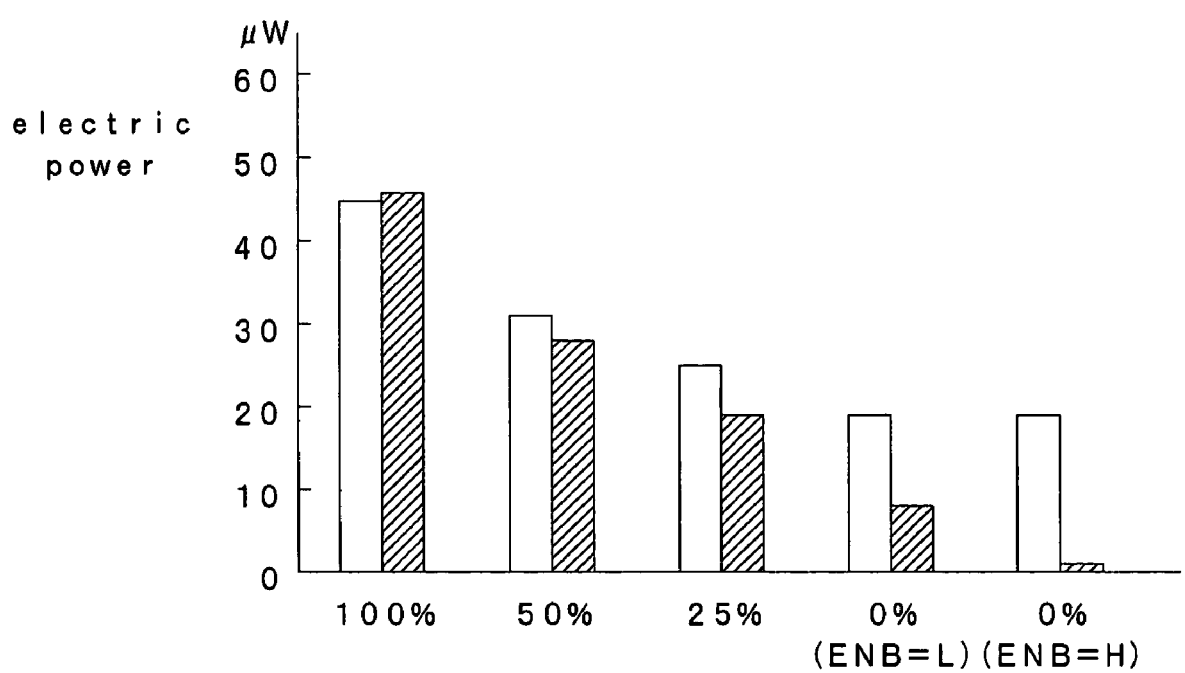
FIG. 21 is a graph showing an effect of reducing power consumption in a circuit of FIG. 20 by taking a data transition rate on its horizontal axis and taking electric power on its vertical axis.

FIG. 21 is a graph showing the effect of reducing the power consumption in the circuit of FIG. 20 by taking the data transition rate on its horizontal axis and taking the electric power on its vertical axis. In FIG. 21, a shaded area indicates a characteristic of the circuit of FIG. 20 while a hollow area indicates a characteristic in the case of adopting a transmission gate flip-flop as a benchmark.

As is apparent from the shaded area of FIG. 21, the power consumption of about 8 μW occurs in the case where the signal ENB is L-level (the enable signal EN is H-level) when the data transition rate is 0%. In comparison, the power consumption is reduced to about 0.3 μW in the case where the signal ENB is H-level (the enable signal EN is L-level) when the data transition rate is 0%.

Thus, the circuit of FIG. 20 has the effect of further reducing the power consumption.

Figure 22:
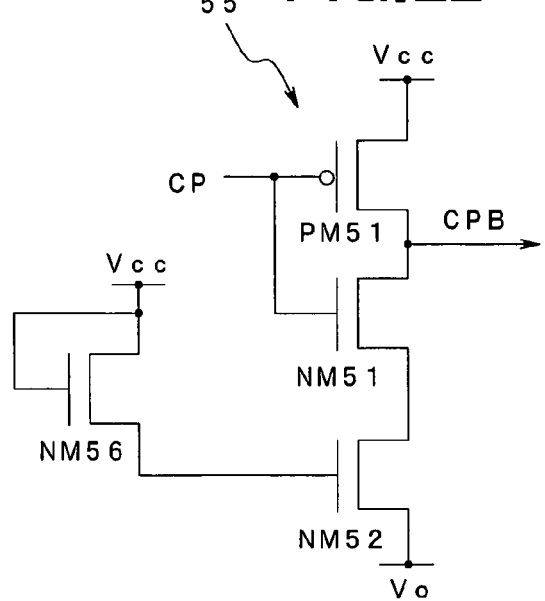
FIG. 22 is a circuit diagram showing another example of a delay inverting circuit of FIG. 19.

FIG. 22 is a circuit diagram showing another example of the delay inverting circuit of FIG. 19. In FIG. 22, the same components as those in FIG. 19 are given the same symbols, and a description thereof will be omitted.

A delay inverting circuit 53 of FIG. 22 has an NMOS transistor NM 56 added to the delay inverting circuit 51. The voltage supply terminal Vcc is connected to the gate of the transistor NM 52 via a source drain path of the transistor NM 56. The power supply voltage Vcc is applied to the gate of the transistor NM 56.

According to the circuit of FIG. 22, the voltage applied to the gate of the transistor NM 52 is decreased by Vth of the transistor NM52 compared to the power supply voltage Vcc, and the transistors of the source drain path of the transistor NM 52 is increased. To be more specific, the time constant of the discharge path of the connection point between the transistors PM 51 and NM 51 changes so as to prolong the falling time of the signal CPB.

To be more specific, the delay inverting circuit 53 can generate the signal CPB of the falling edge different from that of the delay inverting circuit 51 of FIG. 19.

Figure 23:
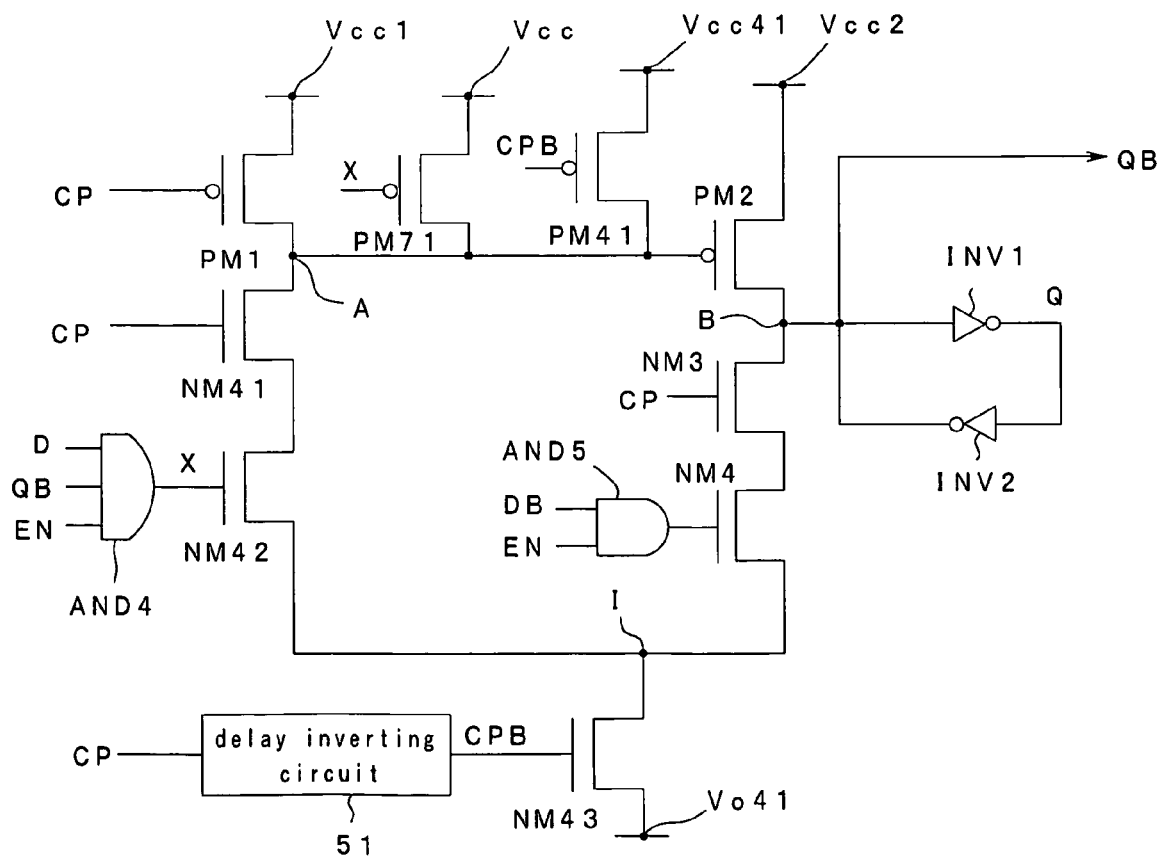
FIG. 23 is a circuit diagram showing another example of the semiconductor integrated circuit device of FIG. 18.

FIG. 23 is a circuit diagram showing another example of the semiconductor integrated circuit device of FIG. 18. In FIG. 23, the same components as those in FIG. 18 are given the same symbols, and a description thereof will be omitted.

The circuit of FIG. 23 is different from the circuit of FIG. 18 in that it adopts an AND logical circuit AND 4 instead of the AND logical circuit AND 1 and has an AND logical circuit AND 5 added thereto.

The AND logical circuit AND 4 has the signals D, QB and EN inputted thereto, and supplies a three-input AND operation result as the signal X to the gate of the transistor NM 42. The AND logical circuit AND 5 has the signals DB and EN inputted thereto, and supplies a two-input AND operation result to the gate of the transistor NM 4.

In the case where the enable signal EN is H-level, it has the same action as FIG. 18 so that the normal flip-flop operation is performed. In the case where the enable signal EN is L-level, the L-level is applied to the gates of the transistors NM 42 and NM 4. To be more specific, the NM 42 and NM 4 are off in this case. Therefore, neither the precharge node A nor the QB output terminal is discharged. To be more specific, the circuit of FIG. 23 stops the flip-flop operation.

In the case of not using the enable signals EN and ENB, redundant internal transition may occur to each of the signals CP even if the data transition rate is 0%. In the configuration of FIG. 23 in comparison, no transition current passes and no power is consumed in the L-level period of the signal EN irrespective of the signal CP.

Thus, the circuit of FIG. 23 can further reduce the power consumption.

Also during the L-level period of the signal EN, two transistors in the discharge path including the transistors NM 41, NM42 and NM43 are turned off, and two transistors in the discharge path including the transistors NM 3, NM4 and NM43 are turned off, thereby making it possible for the circuit of FIG. 23 to reduce the leak current.

Figure 24:
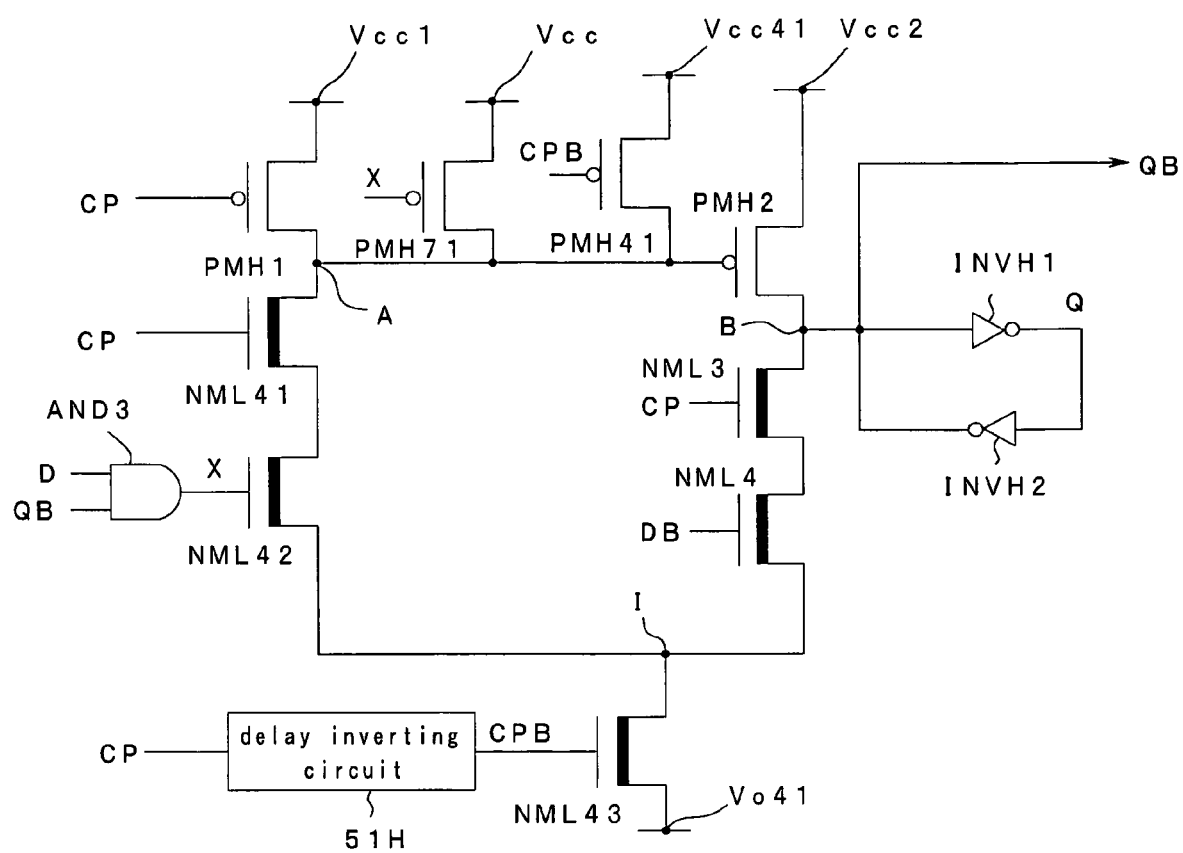
FIG. 24 is a circuit diagram showing a further example of the semiconductor integrated circuit device of FIG. 18.

FIG. 24 is a circuit diagram showing a further example of the semiconductor integrated circuit device of FIG. 18. In FIG. 24, the same components as those in FIG. 18 are given the same symbols, and a description thereof will be omitted.

The circuit of FIG. 24 is different from the circuit of FIG. 18 in that it adopts the transistors of different Vth (threshold voltage) between the transistors on the discharge path of the precharge node A and the QB output terminal and the other transistors.

For instance, the transistors of higher Vth are adopted for PMOS transistors PMH 1, PMH 2, PMH 41 and PMH 71 in comparison to NMOS transistors NML 3, NML 4 and NML 41 to 43. The transistors used for inverters INVH 1, INVH 2 and a delay inverting circuit 51H have higher Vth in comparison to the NMOS transistors NML 3, NML 4 and NML 41 to 43.

In other words, the transistors NML 3, NML 4 and NML 41 to 43 on the discharge path of the precharge node A and the discharge path of the Q output terminal are set to relatively low Vth while the other transistors are set to relatively high Vth. Leakage by the transistors is reduced by setting their Vth high.

Meanwhile, the transistors on the discharge path of the precharge node A and the discharge path of the Q output terminal can have their Vth set low so as to discharge at high speed and obtain high-speed circuits. The source drain paths of multiple transistors are series-connected on the discharge path of the precharge node A and the discharge path of the Q output terminal so that, as a configuration, a leakage current can hardly pass. Therefore, the transistors NML 3, NML 4 and NML 41 to 43 on the discharge path can prevent generation of the leakage current even at relatively low Vth.

A table 2 below is the table for describing a leakage reduction effect of the circuit of FIG. 24.

In the table 2, "after application" indicates the characteristic in the case of setting Vth of the other transistors higher than Vth of the transistor on the discharge path, and "before application" indicates the characteristic in the case of not doing so. "Delay" indicates the delay time from the rising of the signal CP until the signal Q is outputted.

TABLE 2

|  | Leakage current [nA] | Delay [ps] |
| --- | --- | --- |
| Before application | 6.2 | 45 |
| After application | 1.9 | 48 |

As shown in the table 2 above, it is possible, by adopting the circuit of FIG. 24, to suppress the leakage current sufficiently with little change in the delay time. It is also possible, depending on the setting of Vth, to reduce the delay time with little change in the leakage current.

Figure 25:
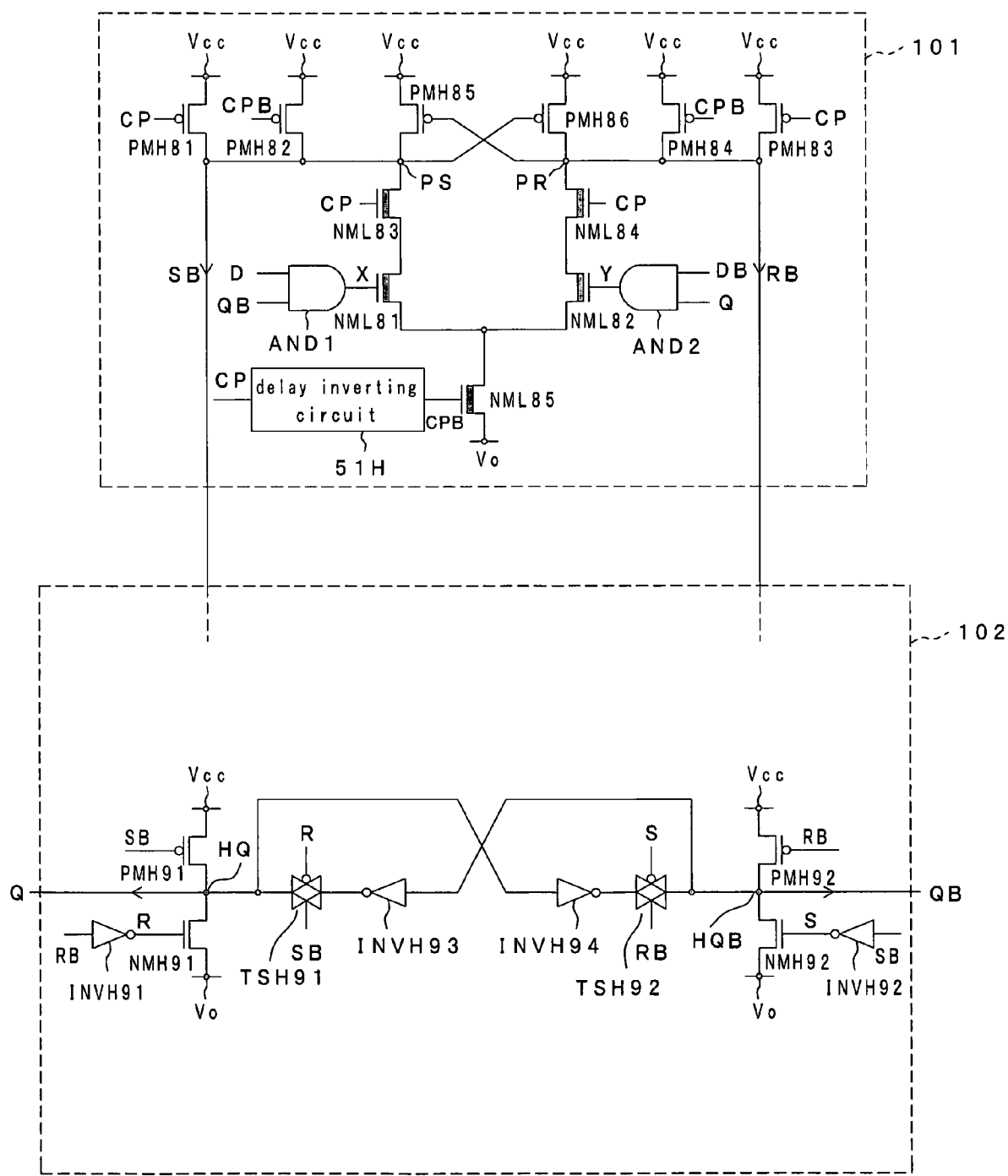
FIG. 25 is a circuit diagram showing a further example of the semiconductor integrated circuit device.

FIG. 25 is a circuit diagram showing a further example of the semiconductor integrated circuit device.

FIG. 25 shows an example of adopting the flip-flop configured by a pulse generator portion 101 and an RS latch portion 102.

<Pulse Generator Portion>

In FIG. 25, the signals D and QB are given to the AND logical circuit AND 1. The AND logical circuit AND 1 performs a two-input AND operation, and supplies the signal X to the gate of an NMOS transistor NML 81. The signals DB and Q are given to the AND logical circuit AND 2. The AND logical circuit AND 2 performs a two-input AND operation, and supplies the signal Y to the gate of an NMOS transistor NML 82.

The pulse generator portion 101 generates pulses SB and RB based on the signals X and Y. The pulses SB and RB are generated by level change in precharge nodes PS and PR in the pulse generator portion 101 respectively.

The precharge node PS is connected to the power supply terminal Vcc via a source drain path of a PMOS transistor PMH 81, a source drain path of a PMOS transistor PMH 82 and a source drain path of a PMOS transistor PMH 85. The precharge node PR is connected to the power supply terminal Vcc via a source drain path of a PMOS transistor PMH 83, a source drain path of a PMOS transistor PMH 84 and a source drain path of a PMOS transistor PMH 86.

The signal CP is supplied to the gates of the transistors PMH 81 and PMH 83, and the signal CPB is supplied to the gates of the transistors PMH 82 and PMH 84. The signal CPB is generated by having the signal CP delayed and inverted by the delay inverting circuit 51H. The precharge node PS is connected to the gate of the transistor PMH 86, and the precharge node PR is connected to the gate of the transistor PMH 85.

The precharge node PS is connected to a first discharge path, and a source drain path of an NMOS transistor NML 83 and the source drain path of the transistor NML 81 are series-connected on the first discharge path. The precharge node PR is connected to a second discharge path, and a source drain path of an NMOS transistor NML 84 and the source drain path of the transistor NML 82 are series-connected on the second discharge path. The sources of the transistors NML 81 and NML 82 are common-connected, where this connection point is connected to the reference potential terminal Vo via a source drain path of the NMOS transistor NML 85 configured on a third discharge path.

The precharge nodes PS and PR of the pulse generator portion 101 get to a level according to the precharge period and the transitional period. The precharge period is set before transition of the state of the Q and QB output terminals of the RS latch portion 102 described later. In this period, the signal CP is L-level, and the transistors PMH 81 and PMH 83 are on. Thus, both the precharge nodes PS and PR are set to the H-level.

The signal CPB is H-level in the precharge period. If the precharge period finishes and the signal CP turns to H-level, the signal CPB turns from H-level to L-level after the delay time of the delay inverting circuit 51H. The transitional period is the period until the signal CP turns to H-level and the signal CPB turns to L-level. In the transitional period, the transistors PMH 81, PMH 83, PMH 82 and PMH 84 for charging the precharge nodes PS and PR are all off, and the level of the precharge nodes PS and PR is decided according to the state of the first and second discharge paths.

In the transitional period, the transistors NML 83 to NML 85 are all on. If the signal D is H-level (the inversion signal DB is L-level) and the signal QB is H-level, the transistor NML 81 becomes on and the transistor NML 82 is off. The electric charge of the precharge node PS is discharged via the first discharge path, and the precharge node PS transitions to L-level internally. Inversely, in the case where the signal D is L-level, the transistor NML 81 is off and the transistor NML 82 is on. The electric charge of the precharge node PR is discharged via the second discharge path, and the precharge node PR transitions to L-level internally.

If one of the precharge nodes PS and PR becomes L-level, one of the transistors PMH 86 and PMH 85 becomes on so as to charge the other of the precharge nodes PS and PR. Thus, in the case where the signal D is H-level, the precharge node PS becomes L-level and the precharge node PR becomes H-level. And in the case where the signal D is L-level, the precharge node PS becomes H-level and the precharge node PR becomes L-level.

If the signal CPB becomes L-level and the transitional period finishes, the transistor NML 85 becomes off so that the conduction of the first and second discharge paths is blocked. On the other hand, the transistors PMH 82 and PMH 84 become on to charge the precharge nodes PS and PR. To be more specific, one of the pulses SB and RB appearing on the precharge nodes PS and PR becomes L-level in the transitional period according to the signals D and DB and keeps H-level in the other periods.

<RS Latch Portion>

The pulses SB and RB are supplied to the RS latch portion 102. The RS latch portion 102 has a first state transition portion consisting of a PMOS transistor PMH 91, an NMOS transistor NMH 91 and an inverter INVH 91 and a second state transition portion consisting of a PMOS transistor PMH 92, an NMOS transistor NMH 92 and an inverter INVH 92 configured therein. The transistor PMH 91 is configured on a first output charge path, and the NMOS transistor NMH 91 is configured on a first output discharge path. The first state transition portion is configured by having a source drain path of the transistor PMH 91 series-connected with a source drain path of the transistor NMH 91 between the power supply terminal Vcc and the reference potential terminal Vo. The inverter INVH 91 generates a pulse R having the pulse RB inverted and provides it to the gate of the transistor NMH 91. The pulse SB is supplied to the gate of the transistor PMH 91. On the other hand, the second state transition portion is configured by having a source drain path of the transistor PMH 92 series-connected with a source drain path of the transistor NMH 92 between the power supply terminal Vcc and the reference potential terminal Vo. The inverter INVH 92 generates a pulse S having the pulse SB inverted and provides it to the gate of the transistor NMH 92. The pulse RB is supplied to the gate of the transistor PMH 92.

A state holding node (Q output terminal) HQ is configured by a connection point between the transistors PMH 91 and NMH 91. A state holding node (QB output terminal) HQB is configured by a connection point between the transistors PMH 92 and NMH 92.

The state holding node HQ is connected to an output terminal of a transfer gate TSH 91 while the state holding node HQB is connected to an output terminal of a transfer gate TSH 92. The state holding node HQB is connected to an input terminal of an inverter INVH 93, where the signal QB is inverted by the inverter INVH 93 and supplied to an input terminal of the transfer gate TSH 91. The state holding node HQ is also connected to an-input terminal of an inverter INVH 94, where the inverter INVH 94 inverts the signal Q and supplies it to an input terminal of the transfer gate TSH 92.

The transfer gate TSH 91 has the pulse R supplied to an inversion control terminal thereof, the pulse SB supplied to a control terminal thereof, and outputs a signal of the input terminal from the output terminal with an L-level pulse R and an H-level pulse SB. The transfer gate TSH 92 has the pulse S supplied to an inversion control terminal thereof, the pulse RB supplied to a control terminal thereof, and outputs a signal of the input terminal from the output terminal with an L-level pulse S and an H-level pulse RB. A holding control portion is configured by the transfer gates TSH 91 and TSH 92, and a holding portion is configured by the inverter INVH 93 and inverter INVH 94.

The RS latch portion 102 thus configured has the two inverters for having mutual outputs inputted configured by the inverter INVH 93 and inverter INVH 94. It is possible, with these inverters, to hold the state of the state holding nodes HQ and HQB.

In the periods other than the transitional period, the pulses SB and RB are H-level. Therefore, the transfer gates TSH 91 and TSH 92 are in a conducting state, and outputs of the inverter INVH 93 and inverter INVH 94 are mutually supplied to the input terminal of the other so as to configure the holding portion. Thus, the level of the state holding nodes HQ and HQB is held.

In the transitional period, one of the pulses SB and RB is L-level and one of the pulses R and S is H-level. Therefore, the transfer gates TSH 91 and TSH 92 are off (local off), and the state of the state holding nodes HQ and HQB is not held. In this case, the state holding nodes HQ and HQB are set to the level according to the pulses SB and RB by the first and second state transition portions.

For instance, let's assume the case where the node HQ is L-level and the node HQB is H-level before the transitional period, and in the transitional period, the signal SB changes to L-level (while the signal RB remains H-level). At this time, the transfer gate TSH 91 become incomplete-off, the node HQ is interrupted from the hold portion (upon local change at the reference voltage), the transfer gate TSH 92 become incomplete-on, and the node HQB is interrupted from the hold portion (upon local change at the power source voltage). On the other hand, if the signal SB changes to L-level, the transistors PMH91 and NMH 92 become on, the transistors NMH91 and PMH 92 become off, the state hold node HQ becomes H-level, and the state hold node HQB becomes L-level. Inversely, in the case where the node HQ is H-level and the node HQB is L-level before the transitional period, and in the transitional period, the signal RB changes to L-level (while the signal SB remains H-level), the transfer gate TSH 91 become incomplete-on, the node HQ is interrupted from the hold portion (upon local change at the power source voltage), the transfer gate TSH 92 become incomplete-off, and the node HQB is interrupted from the hold portion (upon local change at the reference voltage). On the other hand, the transistors PMH91 and NMH 92 become off, the transistors NMH91 and PMH 92 become on, the state hold node HQ becomes L-level, and the state hold node HQB becomes H-level.

In the case where both the signals Q and D are H-level or L-level according to the AND logical circuits AND 1 and AND 2, the transistors NML 81 and NML 82 are off and the precharge nodes PS and PR keep H-level. Therefore, it is possible, in the example of FIG. 25, to eliminate the redundant internal transition and reduce the power consumption.

The example of FIG. 25 adopts the transistors of different Vth between the transistors on the discharge paths of the precharge nodes PR and PB and the other transistors. To be more specific, the NMOS transistors NML 81 to NML 85 on the discharge paths of the precharge nodes PR and PB have their Vth set to a lower value than the other transistors. The transistors used for the inverters INVH 91 to INVH 94, the delay inverting circuit 51H and the transfer gates TSH 91 and TSH 92 also have their Vth set higher than the NMOS transistors NML 81 to NML 85.

Therefore, it is also possible, in the example of FIG. 25, to discharge in a short time with the transistors of low Vth while having the leakage reduced by the transistors of high Vth. To be more specific, it is possible to obtain a circuit of high speed operation and low leakage. In the example of FIG. 25, the transistors NML 81 to NML 85 have multiple source drain paths series-connected to be able to prevent generation of the leakage current even at relatively low Vth.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device, comprising:
a logic holding circuit having
an input terminal portion including two input terminals configured to receive a differential input signal, and
an output terminal portion including a terminal configured to output an output signal based on signals received by the two input terminals, to output signals received by the two input terminals by a trigger signal to the output terminal portion as the output signal, and to maintain a logic of the output signal;
a comparator configured to make a comparison between a logical value of the differential input signal and a logical value of the output signal and to output two signals having logical values based on the comparison, each of the two signals outputted as a voltage signal of low level or high level, wherein
the comparator is configured to output the voltage signals instead of the differential input signal to the input terminal portion when the differential input signal does not vary a state of the output signal.

2. The semiconductor integrated circuit device according to claim 1, wherein the comparator includes comparison portions, each provided to a respective one of the input terminals.

3. The semiconductor integrated circuit device according to claim 2, wherein the comparator is configured by a first AND logical circuit and a second AND logical circuit or is configured by a third AND logical circuit and a NOR logical circuit.

4. A semiconductor integrated circuit device, comprising:
a flip-flop including
a first charge portion and discharge portion configured to charge and to discharge a precharge node,
a second charge portion and discharge portion configured to charge and discharge an output node,
a first switch provided to a discharge path of the first charge portion and discharge portion, and given a first part of a differential input signal to control a conduction and a non-conduction of the first switch, and
a second switch provided to a discharge path of the second charge portion and discharge portion, and given a second part of the differential input signal to control a conduction and a non-conduction of the second switch, the flip-flop having the conduction and the non-conduction of the first switch controlled based on the first part thereby deciding a state of the precharge node to decide a state of logic of the output node; and a control portion configured to generate a predetermined control signal supplied to the first switch and the second switch to stop a discharge operation of the first charge portion and discharge portion and the second charge portion and discharge portion, the control portion configured to supply the predetermined control signal instead of the first part to the first switch and the second part to the second switch when the first part has the same logic value as the output node.

5. The semiconductor integrated circuit device according to claim 4 wherein the control portion is configured to control the first switch based on an AND operation result of an inversion signal of the output node and the first part and to control the second switch based on an AND operation result of a positive phase signal of the output node and an inversion signal of the first part.

6. The semiconductor integrated circuit device according to claim 5, wherein the control portion is configured to control at least one of the first charge portion and discharge portion and the second charge portion and discharge portion based on an AND operation result of the inversion signal, the differential input signal and an enable signal or an AND operation result of the positive phase signal, the inversion signal of the first part, and the enable signal.

7. The semiconductor integrated circuit device according to claim 4 wherein the first charge portion and discharge portion comprises:
a first discharge path configured to be controlled based on a trigger signal; and
a second discharge path configured to be controlled based on an inversion signal of the trigger signal.

8. The semiconductor integrated circuit device according to claim 7, wherein the first and second discharge paths have first and second transistors, respectively, to set a transitional period to permit a discharge of the precharge node provided therein.

9. The semiconductor integrated circuit device according to claim 4 wherein
the first charge portion and discharge portion includes a third discharge path having the first switch;
the second charge portion and discharge portion includes a fourth discharge path having the second switch;
the third discharge path has a third transistor to set a transitional period to permit a discharge of the precharge node provided therein; and
the fourth discharge path has a fourth transistor to set a transitional period to permit a discharge of the output node provided therein.

10. The semiconductor integrated circuit device according to claim 9, wherein the third and fourth discharge paths are common-connected to a fifth discharge path on which a fifth transistor to control a conduction and a non-conduction of the fifth discharge path is provided.

11. A semiconductor integrated circuit device comprising:
a flip-flop including
a first charge portion and discharge portion configured to charge and to discharge a precharge node; and
a second charge portion and discharge portion configured to charge and to discharge an output node and to cause the output node to output an inversion output or a positive phase output according to a state of the precharge node, the flip-flop having the first charge portion and discharge portion controlled based on an input signal thereby deciding the state of the precharge node to decide a state of the inversion output or the positive phase output of the output node; and a control portion configured to stop a discharge operation of at least one of the first charge portion and discharge portion and the second charge portion and discharge portion when the input signal of a same logic value as the positive phase output of the output node is inputted, and to control at least one of the first charge portion and discharge portion and the second charge portion and discharge portion based on a NOR operation result of the positive phase output and an inversion signal of the input signal or a NOR operation result of the inversion output and the input signal.

12. A semiconductor integrated circuit device comprising:
a flip-flop including
a first charge portion and discharge portion configured to charge and to discharge a precharge node, and
a second charge portion and discharge portion configured to charge and to discharge an output node and to cause the output node to output an inversion output or a positive phase output according to a state of the precharge node, the flip-flop having the first charge portion and discharge portion controlled based on an input signal thereby deciding the state of the precharge node to decide a state of the inversion output or the positive phase output of the output node; and a control portion configured to stop a discharge operation of at least one of the first charge portion and discharge portion and the second charge portion and discharge portion when the input signal of a same logic value as the positive phase output of the output node is inputted, wherein the first charge portion and discharge portion includes
a first discharge path configured to be controlled based on a trigger signal, and
a second discharge path configured to be controlled by an inversion signal of the trigger signal, the first and second discharge paths have first and second transistors, respectively, to set a transitional period to permit a discharge of the precharge node, and the first and second discharge paths are common-connected to a third discharge path on which a third transistor to control a conduction and a non-conduction of the third discharge path is provided.

13. A semiconductor integrated circuit device, comprising:
a flip-flop including
a first charge portion and discharge portion configured to charge and to discharge a precharge node; and
a second charge portion and discharge portion configured to charge and to discharge an output node and to cause the output node to output an inversion output or a positive phase output according to a state of the precharge node, the flip-flop having the first charge portion and discharge portion controlled based on an input signal thereby deciding the state of the precharge node to decide a state of the inversion output or the positive phase output of the output node; and a control portion configured to stop a discharge operation of at least one of the first charge portion and discharge portion and the second charge portion and discharge portion when the input signal of a same logic value as the positive phase output of the output node is inputted, wherein the first discharge portion includes a first discharge path configured to be controlled based on the input signal;

the second discharge portion includes a second discharge path configured to be controlled based on the input signal;

the first discharge path has a first transistor to set a transitional period to permit a discharge of the precharge node provided therein;

the second discharge path has a second transistor to set a transitional period to permit a discharge of the output node provided therein;

the first and second transistors are in a non-conduction state in a charge period of the precharge node; and a third transistor is in a conduction state in the charge period of the precharge node.

14. The semiconductor integrated circuit device according to claim 13, wherein a conduction period of the third transistor is acquired by a delay inverting circuit configured to delay and to invert a signal to set the conduction period of the first and second transistors.

15. The semiconductor integrated circuit device according to claim 14, wherein the delay inverting circuit comprises:

fourth and fifth transistors configured to be given a signal to set the conduction period of the first and second transistors to configure an inverter circuit; and a resistance component provided between the fifth transistor and a reference potential point.

16. The semiconductor integrated circuit device according to claim 14, wherein the delay inverting circuit comprises a fourth transistor configured to generate a signal for turning the second transistor off in the transitional period.

17. A semiconductor integrated circuit device comprising:

a flip-flop including a first charge portion and discharge portion configured to charge and to discharge a precharge node, and a second charge portion and discharge portion configured to charge and to discharge an output node and to cause the output node to output an inversion output or a positive phase output according to a state of the precharge node, the flip-flop having the first charge portion and discharge portion controlled based on an input signal thereby deciding the state of the precharge node to decide a state of the inversion output or the positive phase output of the output node; and a control portion configured to stop a discharge operation of at least one of the first charge portion and discharge portion and the second charge portion and discharge portion when the input signal of a same logic value as the positive phase output of the output node is inputted, wherein the first discharge portion includes a first discharge path configured to be controlled based on the input signal;

the second discharge portion includes a second discharge path configured to be controlled based on the input signal;

the first discharge path has a first transistor to set a transitional period to permit a discharge of the precharge node provided therein;

the second discharge path has a second transistor to set a transitional period to permit a discharge of the output node provided therein;

the first and second transistors are in a non-conduction state in a charge period of the precharge node; and a third transistor is in a conduction state in the charge period of the precharge node, and the transistors provided on the first and second discharge paths have a lower threshold voltage Vth than other transistors.

18. A semiconductor integrated circuit device, comprising:

a flip-flop including a first charge portion and discharge portion configured to charge and to discharge a precharge node, a second charge portion and discharge portion configured to charge and to discharge an output node, a first switch provided to a discharge path of the first charge portion and discharge portion, and given a first part of a differential input signal to control a conduction and a non-conduction of the first switch, and a second switch provided to a discharge path of the second charge portion and discharge portion, and given a second part of a differential input signal to control a conduction and a non-conduction of the second switch, the flip-flop having the conduction and the non-conduction of the first switch controlled based on the first part thereby deciding a state of the precharge node to decide a state of logic of the output node; and a control portion configured to supply a signal to the first switch to stop a discharge operation of the first charge portion and discharge portion when the fist part has a same logic value as the output node.

19. The semiconductor integrated circuit device according to claim 18, wherein the control portion is configured to control the first switch based on an AND operation result of an inversion signal of the output node and the first part.

20. The semiconductor integrated circuit device according to claim 18, wherein the control portion is configured to control the first switch based on a NOR operation result of a positive phase signal of the output node and an inversion signal of the first part.

* * * * *